(12) United States Patent
Son et al.

(10) Patent No.: US 12,317,725 B2
(45) Date of Patent: May 27, 2025

(54) DISPLAY DEVICE HAVING AN INPUT SENSING LAYER INCLUDING A DUMMY ELECTRODE AND METHOD OF MANUFACTURING THE SAME

(71) Applicant: SAMSUNG DISPLAY CO., LTD., Yongin-si (KR)

(72) Inventors: Sunkwun Son, Yongin-si (KR); Dong Hee Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/345,235

(22) Filed: Jun. 30, 2023

(65) Prior Publication Data
US 2024/0107851 A1    Mar. 28, 2024

(30) Foreign Application Priority Data
Sep. 28, 2022    (KR) ........................ 10-2022-0123624

(51) Int. Cl.
| | | |
|---|---|---|
| G06F 3/041 | (2006.01) | |
| G06F 3/044 | (2006.01) | |
| H10K 59/123 | (2023.01) | |
| H10K 59/131 | (2023.01) | |
| H10K 59/40 | (2023.01) | |
| H10K 59/80 | (2023.01) | |
| H10K 59/88 | (2023.01) | |
| H10K 71/00 | (2023.01) | |

(52) U.S. Cl.
CPC ........... *H10K 59/40* (2023.02); *G06F 3/0446* (2019.05); *G06F 3/0448* (2019.05); *H10K 59/123* (2023.02); *H10K 59/131* (2023.02); *H10K 59/873* (2023.02); *H10K 59/88* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 2021/0202637 A1 | 7/2021 | Kim et al. | |
| 2023/0004253 A1* | 1/2023 | Shin | ................. G06F 3/0446 |
| 2023/0214076 A1* | 7/2023 | Chu | ................. H10K 59/40 |
| | | | 345/173 |

FOREIGN PATENT DOCUMENTS

| | | |
|---|---|---|
| CN | 111766969 | 10/2020 |
| KR | 10-2020-0082012 | 7/2020 |
| KR | 10-2021-0085997 | 7/2021 |

\* cited by examiner

*Primary Examiner* — Amr A Awad
*Assistant Examiner* — Donna V Bocar
(74) *Attorney, Agent, or Firm* — F. CHAU & ASSOCIATES, LLC

(57) ABSTRACT

A display device includes a display panel including a light emitting element, and an input sensing layer including a sensing electrode and a dummy electrode insulated from the sensing electrode and disposed on the display panel. The light emitting element includes a first electrode, a second electrode disposed on the first electrode, and a light emitting layer interposed between the first electrode and the second electrode. The second electrode is electrically connected to the dummy electrode.

21 Claims, 17 Drawing Sheets

DISPLAY DEVICE HAVING AN INPUT SENSING LAYER INCLUDING A DUMMY ELECTRODE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0123624 filed on Sep. 28, 2022, in the Korean Intellectual Property Office, the disclosure of which is incorporated by reference in its entirety herein.

1. Technical Field

Embodiments of the present disclosure described herein relates to a display device and a method for manufacturing the same, and more particularly, relates to a display device capable of operating with a uniform brightness and a method for manufacturing the display device.

2. Discussion of Related Art

Multimedia electronic devices, such as a television (TV), a cellular phone, a tablet computer, a navigation system, and a game console, include a display device that displays an image. Display devices may include an input sensor that provides a touch-based input for enabling a user to input information or a command.

The display device may include several pixels, where each pixel includes a light emitting element. However, the display device may not display an image with a uniform brightness when a current-resistance (IR) drop occurs due to an increase in resistance of the light emitting element.

SUMMARY

At least one embodiment of the present disclosure provides a display device, capable of applying a uniform driving voltage (that is, a second driving voltage) to light emitting elements provided in a display panel, and a method for manufacturing the same.

According to at least one embodiment, a display device includes a display panel including a light emitting element, and an input sensing layer including a sensing electrode and a dummy electrode insulated from the sensing electrode and disposed on the display panel.

According to an embodiment, the light emitting element includes a first electrode, a second electrode disposed on the first electrode, and a light emitting layer interposed between the first electrode and the second electrode. The second electrode is electrically connected to the dummy electrode.

According to an embodiment, a display device includes a display panel including a light emitting element layer and an encapsulation layer disposed on the light emitting element layer, and an input sensing layer including a sensing electrode and a dummy electrode insulated from the sensing electrode, and disposed on the encapsulation layer.

According to an embodiment, the light emitting element layer includes a first electrode, a second electrode disposed on the first electrode, and a light emitting layer interposed between the first electrode and the second electrode. The second electrode is connected to the dummy electrode through a contact hole located in the encapsulation layer.

According to an embodiment, a method for manufacturing a display device includes forming a light emitting element layer on a base layer, forming an encapsulation layer on the light emitting element layer, and forming an input sensing layer on the encapsulation layer.

According to an embodiment, the input sensing layer includes a sensing electrode and a dummy electrode insulated from the sensing electrode, and the light emitting element layer includes a first electrode, a second electrode disposed on the first electrode, and a light emitting layer interposed between the first electrode and the second electrode. The second electrode is connected to the dummy electrode through a contact hole located in the encapsulation layer and a dummy contact hole located in the input sensing layer.

DETAILED DESCRIPTION

Figure 1A:
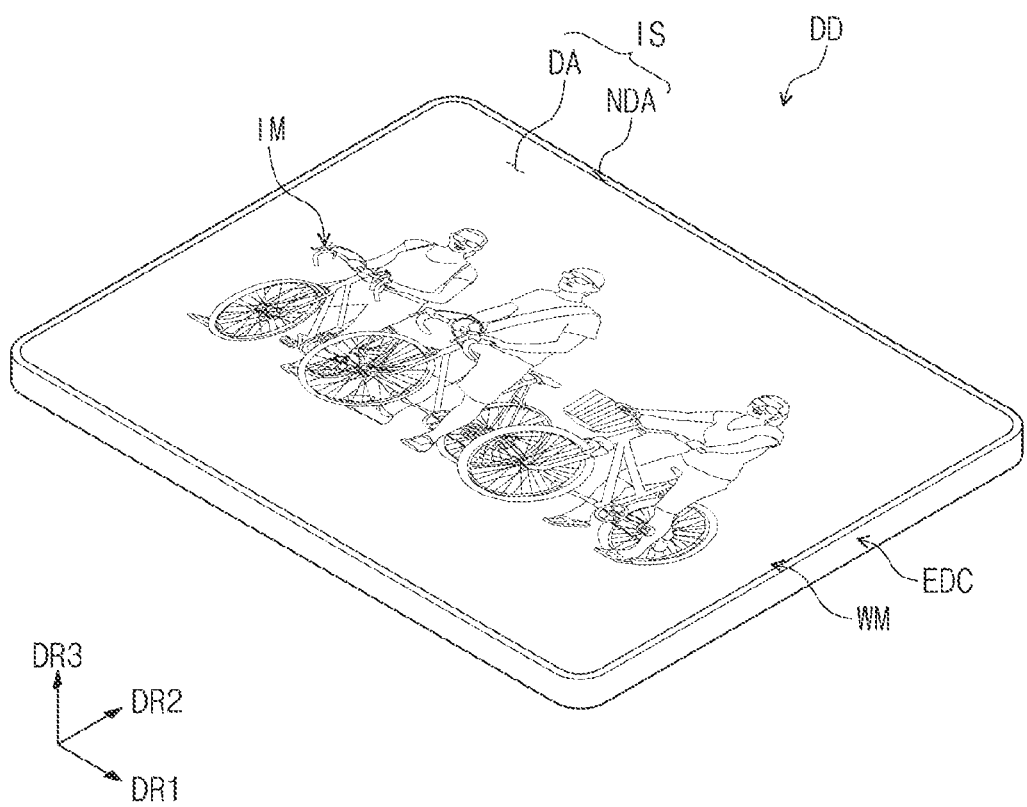
FIG. 1A is a perspective view illustrating a display device according to an embodiment of the present disclosure.

In the specification, the expression that a first component (or region, layer, part, portion, etc.) is "on", "connected to", or "coupled to" a second component means that the first component is directly on, connected to, or coupled to the second component or means that a third component is interposed therebetween.

The same reference numeral may indicate the same component throughout the specification. The term "and/or" includes any and all combinations of one or more of associated components.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "at a lower portion", "above", "an upper portion" are used to describe the relationship between components illustrated in drawings. The terms are relative and are described with reference to a direction indicated in the drawing.

Hereinafter, embodiments of the present disclosure will be described with reference to accompanying drawings.

Figure 1B:
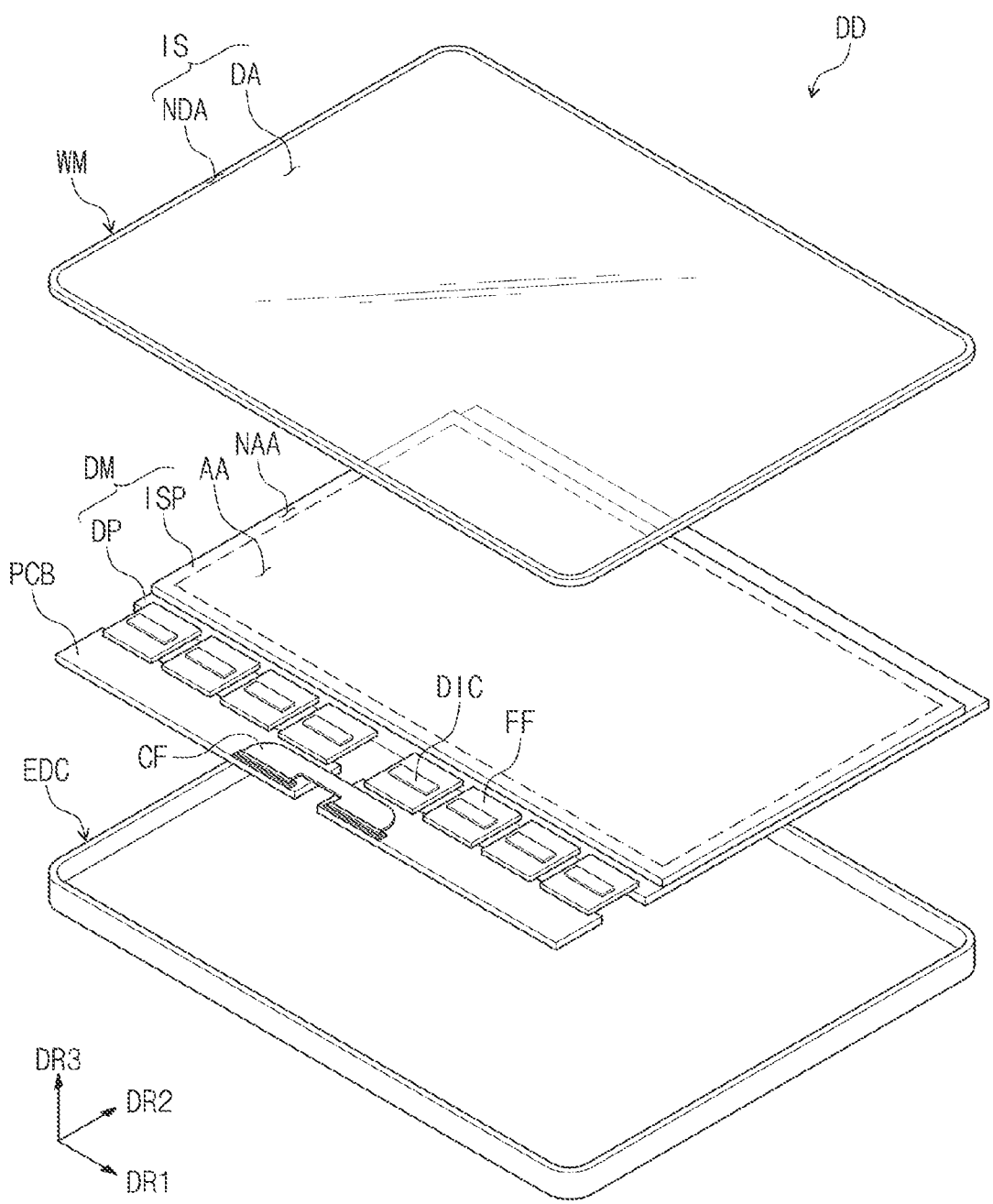
FIG. 1B is an exploded perspective view illustrating a display device according to an embodiment of the present disclosure.
Figure 2A:
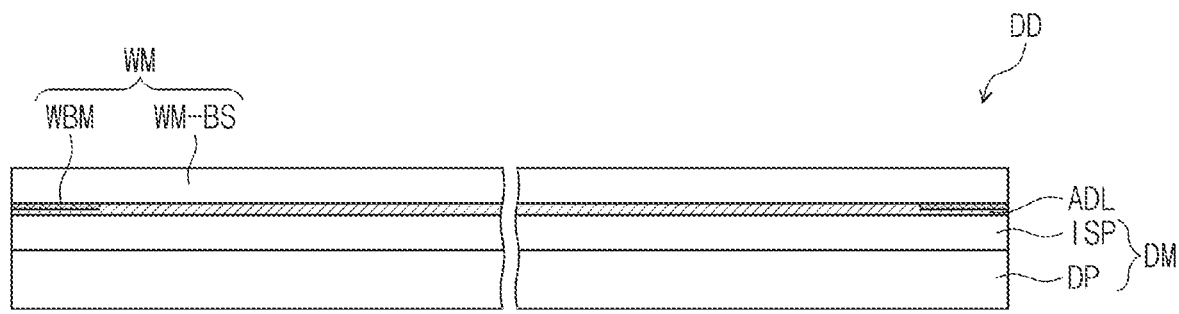
FIGS. 2A and 2B are cross-sectional views of a display device according to an embodiment of the present disclosure.
Figure 2B:
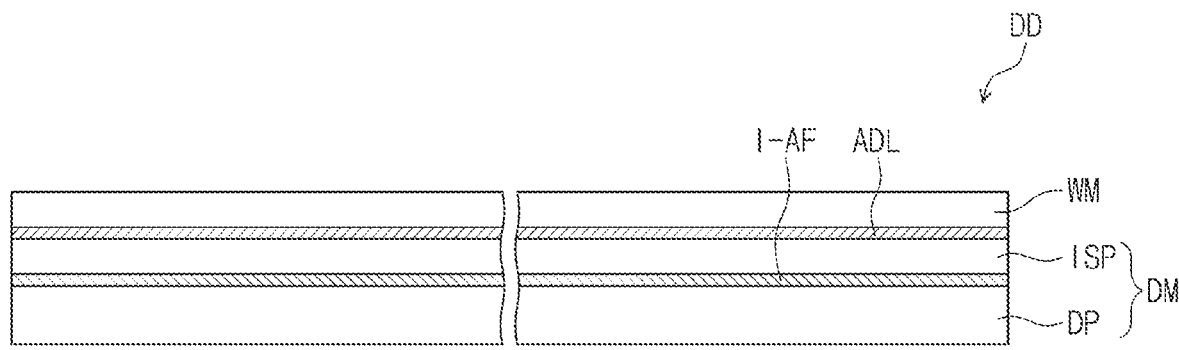

FIG. 1A is a perspective view illustrating a display device according to an embodiment of the present disclosure. FIG. 1B is an exploded perspective view illustrating a display device according to an embodiment of the present disclosure. FIGS. 2A and 2B are cross-sectional views of a display device according to an embodiment of the present disclosure.

Referring to FIGS. 1A and 1B, a display device DD may be a device activated in response to an electrical signal. According to the present disclosure, the display device DD may include a smaller or medium-size display device, such as a cellular phone, a tablet PC, a laptop computer, a vehicle navigation, or a game console as well as a large-size display device, such as a television or a monitor. The above examples are provided only for the illustrative purpose since the display device DD may be implemented in various forms without departing from the concept of the present disclosure. The display device DD has a rectangular shape having a longer side in a first direction DR1, and a shorter side in a second direction DR2 crossing the first direction DR1. However, the shape of the display device DD is not limited thereto, but various display devices DD having various shapes may be provided. The display device DD may display an image IM, in a third direction DR3, on a display surface IS parallel to the first direction DR1 and the second direction DR2. The display surface IS to display the image IM may correspond to a front surface of the display device DD.

According to an embodiment, a front surface (or top surface) and a rear surface (or a bottom surface) of each of members are defined based on a direction that the image IM is displayed. The front surface and the rear surface are opposite to each other in the third direction DR3, and a normal direction to the front surface and the rear surface may be in parallel to the third direction DR3.

The spacing between the front surface and the rear surface in the third direction DR3 may correspond to the thickness of the display device DD in the third direction DR3. Meanwhile, the first direction DR1, the second direction DR2, and the third direction DR3 may be relative concepts and may be changed to different directions.

The display device DD may sense an external input applied from the outside. The external input may include various types of inputs that are provided from the outside of the display device DD. According to an embodiment of the present disclosure, the display device DD may sense an external input of the user, which is applied from the outside. The external input of the user may include any one of various external inputs, such as a part of a body of the user, light, heat, a gaze, or pressure, or the combination thereof. In addition, the display device DD may sense the external input of the user, which is applied to the side surface or the back surface of the display device DD depending on the structures of the display device DD, and is not limited to any one embodiment. For example, according to an embodiment of the present disclosure, the external input may include an input made by an input device (e.g., a stylus pen, an active pen, a touch pen, an electronic pen, or an e-pen).

The display surface IS of the display device DD may be divided into a display region DA and a non-display region NDA. The display region DA may be a region for displaying the image IM. A user views the image IM through the display region DA. According to the present embodiment, the display region DA is illustrated as a rectangular shape rounded in vertexes. However, the shape is provided for the illustrative purpose. For example, the display region DA may have various shapes, and is not limited to any one embodiment.

The non-display region NDA is adjacent to the display region DA. The non-display region NDA may have a specific color. The non-display region NDA may surround the display region DA. The shape of the display region DA may be defined by the non-display region NDA. However, the above shape of the display region DA is provided for illustrative purpose. For example, the non-display region NDA may be disposed to be adjacent to only one side of the display region DA or may be omitted. According to an embodiment of the present disclosure, the display device DD may include various embodiments, and is not limited to any one embodiment.

As illustrated in FIGS. 1B and 2A, the display device DD may include a display module DM and a window WM disposed on the display module DM. The display module DM may include a display panel DP and an input sensing layer ISP.

According to an embodiment of the present disclosure, the display panel DP may include an emissive display panel. For example, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and a quantum rod.

The display panel DP may output the image IM, and the output image IM may be displayed through the display surface IS.

The input sensing layer ISP may be disposed on the display panel DP to sense the external input. The input sensing layer ISP may be directly disposed on the display panel DP. According to an embodiment of the present disclosure, the input sensing layer ISP may be formed on the display panel DP through a subsequent process. In other words, when the input sensing layer ISP is directly disposed on the display panel DP, an inner adhesive film is not interposed between the input sensing layer ISP and the display panel DP. Alternatively, as illustrated in FIG. 2B, an inner adhesive film I-AF may be interposed between the input sensing layer ISP and the display panel DP. In this case, the input sensing layer ISP is not fabricated together with the display panel DP through the subsequent processes. In other words, after fabricating the input sensing layer ISP through a process separate from that of the display panel DP, the input sensing layer ISP may be fixed on a top surface of the display panel DP through the inner adhesive film I-AF.

The window WM may include a window base layer WM-BS including a transparent material to output the image IM. For example, the window base layer WM-BS may include glass, sapphire, or plastic. Although FIG. 2A illustrates that the window base layer WM-BS includes a single layer, the present disclosure is not limited thereto. The window base layer WM-BS may include a plurality of layers.

The non-display region NDA of the display device DD may be provided by printing one region of the window WM with a material including a specific color. According to an embodiment of the present disclosure, the window WM may include a light blocking pattern WBM for defining the non-display region NDA. The light blocking pattern WBM, which has the form of an organic film having a color, may be formed in, for example, a coating manner.

The window WM may be coupled to the display module DM through an adhesive film ADL. According to an embodiment of the present disclosure, the adhesive film ADL may include an optically clear adhesive film (OCA). However, the adhesive film ADL is not limited thereto, but may include an adhesive agent. For example, the adhesive film ADL may include an optically clear resin (OCR) or a pressure sensitive adhesive (PSA) film.

An anti-reflective layer may be further disposed between the window WM and the display module DM. The anti-reflective layer decreases reflectivity of an external light incident from above the window WM. According to an embodiment of the present disclosure, the anti-reflective layer may include a phase retarder and a polarizer. The phase retarder may be provided in a film type or a liquid crystal coating type, and may include a k/2 phase retarder and/or a k/4 phase retarder. The polarizer may also have a film type or a liquid crystal coating type. The film type polarizer may include a stretched synthetic resin film, and the liquid crystal coating type polarizer may include liquid crystals aligned in a specific array. The phase retarder and the polarizer may be implemented with one polarization film.

According to an embodiment of the present disclosure, the anti-reflective layer may include color filters. The arrangement of the color filters may be determined based on colors of light generated from a plurality of pixels PX (see FIG. 4A) included in the display panel DP. In this case, the anti-reflective layer may further include a light blocking pattern interposed between the color filters.

The display module DM may display the image IM in response to an electrical signal, and may transmit/receive information on an external input. The display module DM may be defined with an active region AA and a non-active region NAA. The active region AA may be a region defined to output the image IM (to display the image IM) from the display panel DP. In addition, the active region AA may be defined as a region in which the input sensing layer ISP senses the external input applied from the outside. According to an embodiment, the active region AA of the display module DM may correspond to at least a portion of the display region DA.

The non-active region NAA may be adjacent to the active region AA. The non-active region NAA may be a region in which the image IM is not displayed. For example, the non-active region NAA may surround the active region AA. However, the above form is provided for the illustrative purpose. For example, the non-active region NAA may have various forms, and is not limited to any one embodiment. According to an embodiment, the non-active region NAA of the display module DM may correspond to (be overlapped with) at least a portion of the non-display region NDA.

The display device DD may include a plurality of flexible films FF connected to the display panel DP and a plurality of driving chips DIC mounted on the plurality of flexible films FF, respectively.

The display device DD may further include at least one printed circuit board PCB coupled to the plurality of flexible films FF. According to an embodiment of the present disclosure, although four printed circuit boards PCB are provided in the display device DD, the number of printed circuit boards PCB is not limited thereto. Two adjacent printed circuit boards PCB of the printed circuit boards PCB may be electrically connected to each other by a connection film CF. In addition, at least one of the printed circuit boards PCB may be electrically connected to a main board. A driving controller and a voltage generator may be disposed on at least one of the printed circuit boards PCB.

Although FIG. 1B illustrates that the driving chips DIC are mounted on the plurality of flexible films FF, the present disclosure is not limited thereto. For example, the driving chips DIC may be directly mounted on the display panel DP. In this case, the mounting part of the driving chips DIC on the display panel may be bent and disposed on the rear surface of the display module DM.

The input sensing layer ISP may be electrically connected to the printed circuit board PCB through the plurality of flexible films FF. However, the present disclosure is not limited thereto. In other words, the display module DM may further include an additional flexible film to electrically connect the input sensing layer ISP to the printed circuit board PCB.

The display device DD may further include a housing EDC to receive the display module DM. The housing EDC may be coupled to the window WM to define an outer appearance of the display device DD. The housing EDC may absorb the impact applied from the outside and prevent a foreign substance/moisture from being infiltrated into the display module DM to protect components received in the housing EDC. Meanwhile, according to an embodiment of the present disclosure, the housing EDC may be provided in the form in which the plurality of receiving members is coupled.

The display device DD according to an embodiment may further include an electronic module including various functional modules to operate the display module DM, a power supply module (e.g., a battery) to supply power necessary for overall operations of the display device DD, a bracket coupled with the display module DM and/or the housing EDC to partition an inner space of the display device DD, etc.

Figure 3A:
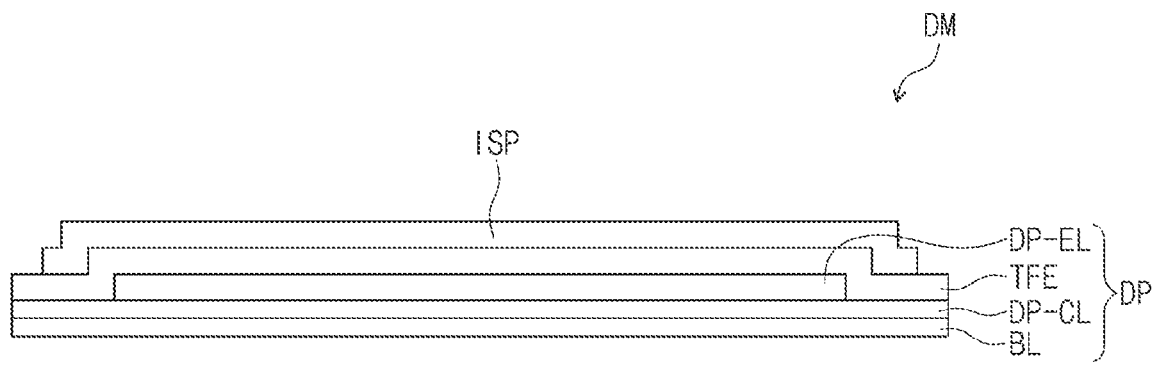
FIGS. 3A and 3B are cross-sectional views illustrating a display module according to an embodiment of the present disclosure.
Figure 3B:
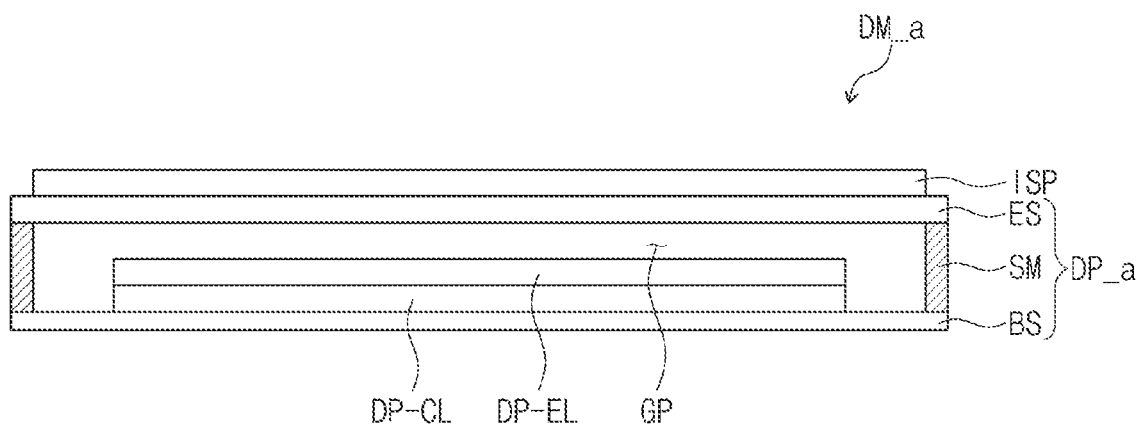

FIGS. 3A and 3B are cross-sectional views of a display module, according to an embodiment of the present disclosure.

Referring to FIG. 3A, according to an embodiment of the present disclosure, the display module DM includes the display panel DP and the input sensing layer ISP disposed on the display panel DP. The display panel DP includes a base layer BL, a circuit element layer DP-CL disposed on the base layer BL, a light emitting element layer DP-EL, and an encapsulation layer TFE.

The base layer BL may include at least one plastic film. The base layer BL may include a plastic substrate, a glass substrate, a metal substrate, or an organic/inorganic composite material substrate. According to an embodiment, the base layer BL may be a thin film glass substrate having a thickness of several tens to several hundreds of micrometers. The base layer BL may have a multi-layer structure. For example, the base layer BL may include an organic layer (e.g., a polyimide layer)/at least one inorganic layer/an organic layer (e.g., a polyimide layer).

In an embodiment, the circuit element layer DP-CL includes at least one insulating layer and a circuit element.

The insulating layer may include at least one inorganic layer and at least one organic layer. The circuit element may include signal lines, and a pixel circuit. Hereinafter, the details thereof will be described later.

The light emitting element layer DP-EL includes at least a light emitting element. The light emitting element layer DP-EL may further include an organic layer such as a pixel defining film.

The encapsulation layer TFE may include a plurality of insulating layers. The encapsulation layer TFE may be a thin film encapsulation layer including at least one inorganic layer and at least one organic layer sequentially stacked on each other. According to an embodiment of the present disclosure, the encapsulation layer TFE may include a first encapsulation inorganic layer, an encapsulation organic layer, and a second encapsulation inorganic layer sequentially stacked on each other. Alternatively, the display module DM may further include a protective layer (or a capping layer) interposed between the encapsulation layer TFE and the light emitting element layer DP-EL.

Referring to FIG. 3B, according to an embodiment of the present disclosure, in a display module DM_a, a display panel DP_a includes a base substrate BS, the circuit element layer DP-CL, the light emitting element layer DP-EL, and an encapsulation substrate ES. The display panel DP of FIG. 2A or FIG. 2B may be implemented by the display panel DP_a.

The base substrate BS and the encapsulation substrate ES may include a plastic substrate, a glass substrate, a metal substrate, or an organic/inorganic composite material. The encapsulation substrate ES may be spaced apart from the light emitting element layer DP-EL by a specific gap GP. The gap GP may be filled with a specific material. An absorbent or a resin material may be filled in the gap GP.

The display panel DP_a may further include a sealant SM between the base substrate BS and the encapsulation substrate ES. The base substrate BS and the encapsulation substrate ES may be coupled to each other by the sealant SM and the gap GP may be sealed. The sealant SM may include an organic adhesive or a frit.

Figure 4A:
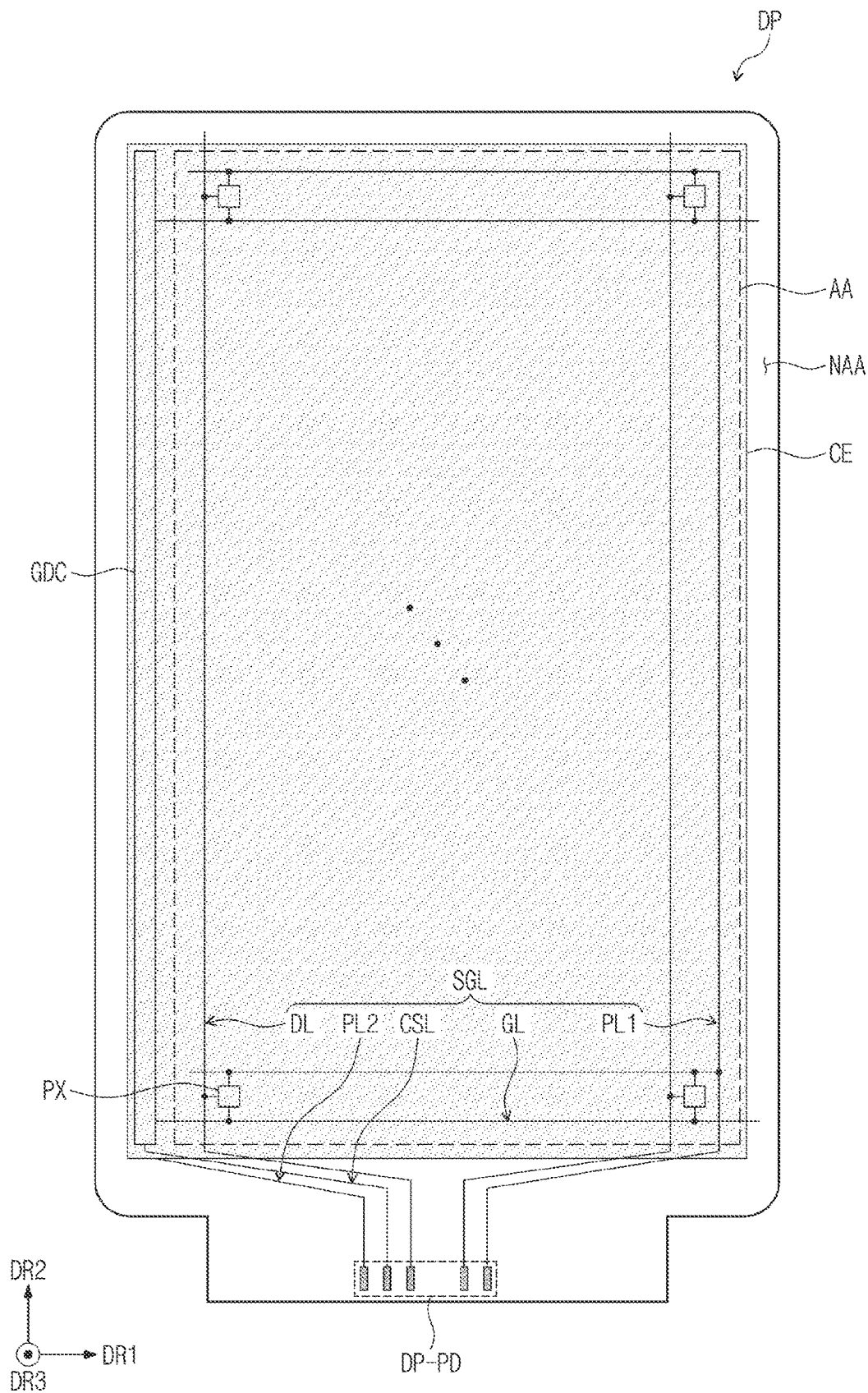
FIG. 4A is a plan view illustrating a display panel according to an embodiment of the present disclosure.
Figure 4B:
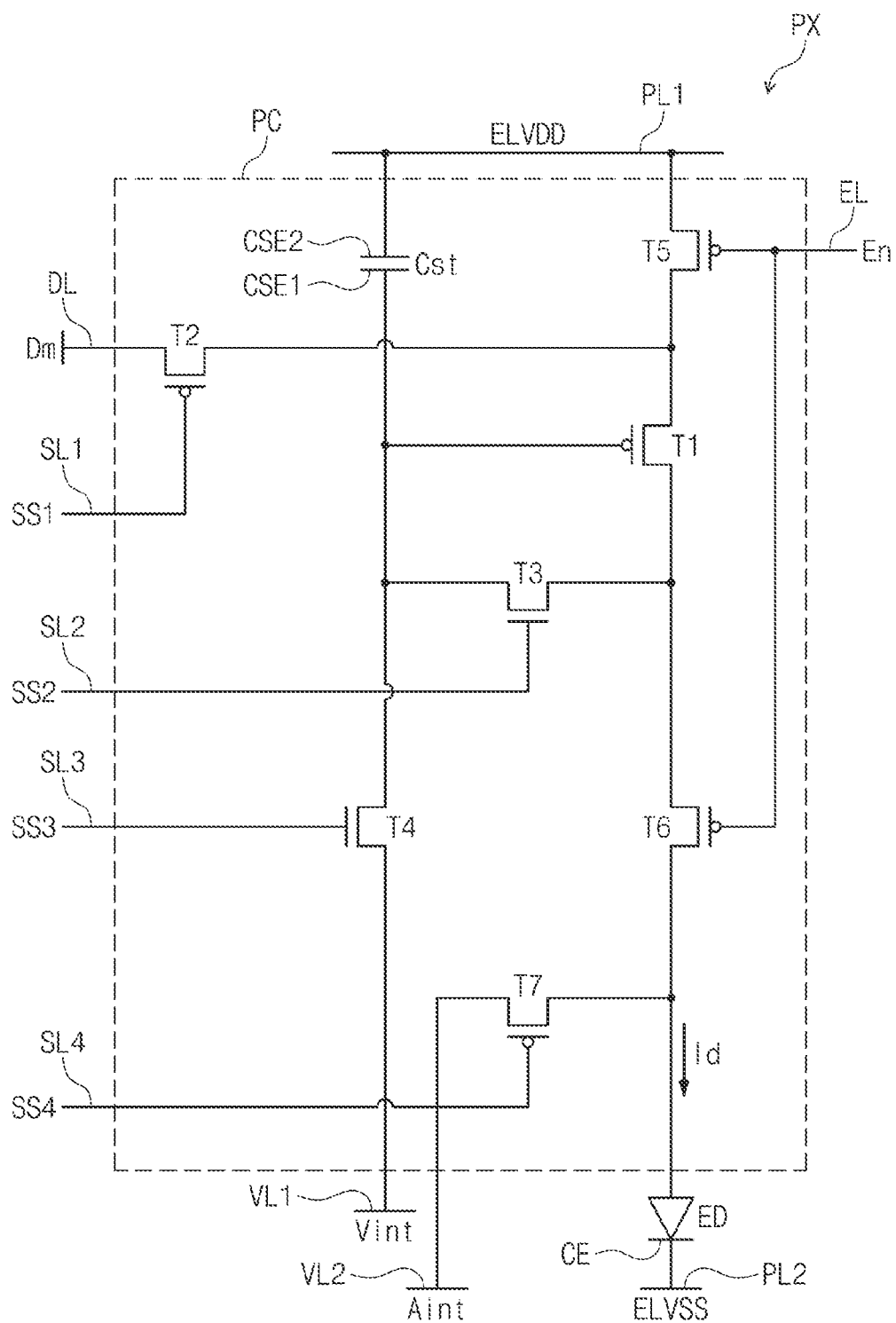
FIG. 4B is a circuit diagram illustrating a pixel according to an embodiment of the present disclosure.

FIG. 4A is a plan view of a display panel according to an embodiment of the present disclosure, and FIG. 4B is a circuit diagram illustrating a pixel, according to an embodiment of the present disclosure.

Referring to FIG. 4A, the display panel DP may be divided into the active region AA and the non-active region NAA. The active region AA may include a region for displaying an image. The non-active region NAA may be a region having a driving circuit or a driving line. Light emitting elements of the plurality of pixels PX may be disposed in the active region AA. The active region AA and the non-active region NAA of the display panel DP may correspond to the display region DA and the non-display region NDA of the display device DD illustrated in FIG. 1A. The active region AA may overlap with at least a portion of the display region DA of the display device DD, and the non-active region NAA may be covered by the non-display region NDA of the display device DD.

According to an embodiment, the display panel DP may include a plurality of pixels PX, a plurality of signal lines SGL, a scanning driving circuit GDC, and a display pad part DP-PD.

Each of the pixels PX may include a light emitting element and a pixel driving circuit connected to the light emitting element. The pixels PX may emit light in response to an electrical signal applied to the pixel PX.

The signal lines SGL may include scanning lines GL, data lines DL, first and second power lines PL1 and PL2, and a control signal line CSL. The scanning lines GL may be connected to relevant pixels PX among the pixels PX, respectively. The data lines DL may be connected to corresponding pixels PX among the pixels PX, respectively. The first and second power lines PL1 and PL2 may be connected to the pixels PX to provide first and second driving voltages, respectively. In particular, the second power line PL2 may be electrically connected to one electrode CE (which may be referred to as a cathode electrode or a second electrode) of the light emitting element to supply a second driving voltage. The control signal line CSL may provide control signals to the scanning driving circuit GDC.

The scanning driving circuit GDC may be disposed in the non-active region NAA. The scanning driving circuit GDC may generate scanning signals and sequentially output the scanning signals to the scanning lines GL. The scanning driving circuit GDC may further provide signals other than scanning signals to the pixels PX.

The scanning driving circuit GDC may include a plurality of transistors formed through the same process as the pixel driving circuit of the pixels PX, in which the process may include a low temperature polycrystalline silicon (LTPS) process or a low temperature polycrystalline oxide (LTPO) process.

The display pad part DP-PD may be disposed adjacent to an end of the non-active region NAA. The signal lines SGL may extend to the non-active region NAA and may be connected to the display pad part DP-PD. A plurality of flexible films FF (see FIG. 1B) may be electrically connected to the display pad part DP-PD. As a plurality of flexible films FF is attached to the display pad part DP-PD through a conductive adhesive film, the display panel DP and the plurality of flexible films FF may be electrically connected to each other. Meanwhile, the driving chips DIC may be mounted on the plurality of flexible films FF or the non-active region NAA of the display panel DP, and may include a data driving circuit.

FIG. 4B illustrates an equivalent circuit diagram of one pixel PX of the plurality of pixels PX. The pixel PX may include a light emitting element ED and a pixel driving circuit PC. The light emitting element ED may be a component included in the light emitting element layer DP-EL of FIG. 3A, and the pixel driving circuit PC may be included in the circuit element layer DP-CL of FIG. 3A.

The pixel driving circuit PC may include a plurality of transistors T1 to T7 and a storage capacitor Cst. The pixel driving circuit PC may be electrically connected to signal lines SL1, SL2, SL3, SL4, EL, and DL, a first initialization voltage line VL1, a second initialization voltage line VL2 (or an anode initialization voltage line), and the first power line PL1. According to an embodiment, at least one of the above-described lines, for example, the first power line PL1, may be shared with neighboring pixels PX.

The plurality of transistors T1 to T7 may include a driving transistor T1 (or a first transistor), a switching transistor T2 (or a second transistor), a compensation transistor T3 (or a third transistor), the first initialization transistor T4 (or a fourth transistor), a first control transistor T5 (or a fifth transistor), a second control transistor T6 (or a sixth transistor), and a second initialization transistor T7 (or a seventh transistor).

The light emitting element ED may include a first electrode (e.g., an anode electrode) and a second electrode CE (e.g., a cathode electrode). The first electrode of the light emitting element ED may be connected to the driving transistor T1 through the second control transistor T6 to receive a driving current Id, and the second electrode CE of the light emitting element ED may receive a second driving voltage ELVSS connected to the second power line PL2. The light emitting element ED may generate light having a brightness corresponding to the driving current Id. According to an embodiment, the second electrode CE of the light emitting element ED may serve as a common electrode commonly connected to the pixels PX.

Some of the plurality of transistors T1 to T7 may be provided in the form of an n-channel MOSFET (NMOS), and remaining transistors of the plurality of transistors T1 to T7 may be provided in the form of a p-channel MOSFET (PMOS). For example, the compensation transistor T3 and the first initialization transistor T4 of the plurality of transistors T1 to T7 may be provided in the form of the n-channel MOSFET (NMOS), and remaining transistors of the plurality of transistors T1 to T7 may be provided in the form of a p-channel MOSFET (PMOS).

According to an embodiment, the compensation transistor T3, the first initialization transistor T4, and the second initialization transistor T7 of the plurality of transistors T1 to T7 are provided in the form of an NMOS, and remaining transistors of the plurality of transistors T1 to T7 may be provided in the form of a PMOS. Alternatively, only one of the plurality of transistors T1 to T7 may be provided in the form of an NMOS, and remaining transistors of the plurality of transistors T1 to T7 may be provided in the form of a PMOS. Alternatively, all transistors of the plurality of transistors T1 to T7 may be provided in the form of an NMOS, or a PMOS.

The signal lines may be the first scanning line SL1 to transmit a first scanning signal SS1, the second scanning line SL2 to transmit a second scanning signal SS2, the third scanning line SL3 to transmit a third scanning signal SS3 to the first initialization transistor T4, a light emitting control line EL to transmit a light emitting control signal En to the first control transistor T5 and the second control transistor T6, the fourth scanning line SL4 to transmit a fourth scanning signal SS4 to the second initialization transistor T7, and the data line DL to transmit a data signal Dm. The data line DL may cross the first scanning line SL1.

The first power line PL1 may transmit a first driving voltage ELVDD to the driving transistor T1, and the first initialization voltage line VL1 may transmit a first initialization voltage Vint for initializing a gate electrode of the driving transistor T1 and the first electrode of the light emitting element ED.

The gate electrode of the driving transistor T1 may be connected to the storage capacitor Cst, the first electrode (or source electrode) of the driving transistor T1 may be connected to the first power line PL1 through the first control transistor T5, and the second electrode (or drain electrode) of the driving transistor T1 may be electrically connected to the first electrode of the light emitting element ED through the second control transistor T6. The driving transistor T1 may receive the data signal Dm depending on the switching operation of the switching transistor T2 and supply the driving current Id to the light emitting element ED.

The gate electrode of the switching transistor T2 may be connected to the first scanning line SL1 to transmit the first scanning signal SS1, the first electrode of the switching transistor T2 may be connected to the data line DL, and the second electrode of the switching transistor T2 may be connected to the first electrode of the driving transistor T1. The switching transistor T2 may be turned on in response to the first scanning signal SS1 received through the first scanning line SL1 to perform a switching operation of transmitting the data signal Dm transmitted from the data line DL to the first electrode of the driving transistor T1.

The gate electrode of the compensation transistor T3 is connected to the second scanning line SL2. The first electrode of the compensation transistor T3 may be connected to the second electrode of the driving transistor T1, and the second electrode of the compensation transistor T3 may be connected to a first electrode CSE1 of the storage capacitor Cst and the gate electrode of the driving transistor T1. The compensation transistor T3 may be turned on in response to the second scanning signal SS2 received through the second scanning line SL2 to electrically connect the gate electrode and the second electrode of the driving transistor T1 such that the driving transistor T1 is diode-connected.

The gate electrode of the first initialization transistor T4 may be connected to the third scanning line SL3. A first electrode of the first initialization transistor T4 may be connected to the first initialization voltage line VL1, and a second electrode of the first initialization transistor T4 may be connected to the first electrode CSE1 of the storage capacitor Cst, the second electrode of the compensation transistor T3, and the gate electrode of the driving transistor T1. The first initialization transistor T4 may be turned on in response to the third scanning signal SS3 received through the third scanning line SL3 to transmit the first initialization voltage Vint to the gate electrode of the driving transistor T1 such that the gate electrode of the driving transistor T1 is initialized to the first initialization voltage Vint.

The gate electrode of the first control transistor T5 may be connected to the light emitting control line EL, the first electrode of the first control transistor T5 may be connected to the first power line PL1, and the second electrode of the first control transistor T5 may be connected to the first electrode of the driving transistor T1 and the second electrode of the switching transistor T2.

The gate electrode of the second control transistor T6 is connected to the light emitting control line EL, and the first electrode of the second control transistor T6 is connected to the second electrode of the driving transistor T1 and the first electrode of the compensation transistor T3. The second electrode of the second control transistor T6 is connected to the first electrode of the light emitting element ED.

The first control transistor T5 and the second control transistor T6 may be simultaneously turned on in response to the light emitting control signal En received through the light emitting control line EL, and the first driving voltage ELVDD is transmitted to the light emitting element ED, such that the driving current Id flows through the light emitting element ED. Alternatively, the first control transistor T5 and the second control transistor T6 may be connected to mutually different light emitting control lines, respectively.

The gate electrode of the second initialization transistor T7 may be connected to the fourth scanning line SL4, and the first electrode of the second initialization transistor T7 may be connected to the second initialization voltage line VL2 to receive a second initialization voltage Aint. The second electrode of the second initialization transistor T7 is connected to the second electrode of the second control transistor T6 and the first electrode of the light emitting element ED. The second initialization transistor T7 is turned on in response to the fourth scanning signal SS4 received through the fourth scanning line SL4 to initialize the first electrode of the light emitting element ED to the second initialization voltage Aint.

According to an embodiment, the second initialization transistor T7 may be connected to the light emitting control line EL to be driven in response to the light emitting control signal En. For example, a gate electrode of the second initialization transistor T7 could be connected to the light emitting control line EL. Meanwhile, the positions of the first and second electrodes of each transistor may be changed, depending on the type (p-type or n-type) of the transistor.

The storage capacitor Cst may include the first electrode CSE1 and a second electrode CSE2. The first electrode CSE1 of the storage capacitor Cst is connected to the gate electrode of the driving transistor T1, and the second electrode CSE2 of the storage capacitor Cst is connected to the first power line PL1. The storage capacitor Cst may store charges corresponding to the difference between a potential of the gate electrode of the driving transistor T1 and the first driving voltage ELVDD.

Specific operations of each pixel PX according to an embodiment are as follows.

During an initialization period, when the third scanning signal SS3 is supplied through the third scanning line SL3, the first initialization transistor T4 is turned on corresponding to the third scanning signal SS3, and the driving transistor T1 is initialized by the first initialization voltage Vint supplied through the first initialization voltage line VL1.

During a data programming period, when the first scanning signal SS1 and the second scanning signal SS2 are supplied through the first scanning line SL1 and the second scanning line SL2, the switching transistor T2 and the compensation transistor T3 are turned on to correspond to the first scanning signal SS1 and the second scanning signal SS2. In this case, the driving transistor T1 is diode-connected by the turned-on compensation transistor T3, and is biased in the forward direction.

Then, the gate electrode of the driving transistor T1 is applied with a compensation voltage (Dm+Vth; Vth is a negative, (-) value) which is obtained by subtracting a threshold voltage (Vth) of the driving transistor T1 from the data signal Dm supplied from the data line DL.

The first driving voltage ELVDD and the compensation voltage Dm+Vth are applied to two ends of the storage capacitor Cst, and charges corresponding to the voltage difference between the two ends of the storage capacitor Cst are stored in the storage capacitor Cst.

During a light emitting period, the first control transistor T5 and the second control transistor T6 are turned on in response to the light emitting control signal En supplied from the light emitting control line EL. The driving current Id is generated to correspond to the difference between the voltage of the gate electrode of the driving transistor T1 and the first driving voltage ELVDD, and is supplied to the light emitting element ED through the second control transistor T6.

According to an embodiment, at least one of the plurality of transistors T1 to T7 includes a semiconductor layer including an oxide, and remaining transistors of the plurality of the transistors T1 to T7 includes a semiconductor layer including silicon. In detail, the driving transistor T1 directly exerting an influence on the brightness of the display device may be configured to include a semiconductor layer including polycrystalline silicon, thereby implementing a higher-resolution display device. However, since the oxide semiconductor has higher carrier mobility and low leakage current, the voltage drop is not significant even if the driving time is long. In other words, even during low-frequency driving, the color of the image is not significantly changed by the voltage drop. Accordingly, the low-frequency driving is possible.

As described above, a weak leakage current may occur in the oxide semiconductor. Accordingly, when at least one of the compensation transistor T3 and the first initialization transistor T4 employs the oxide semiconductor, the leakage current is prevented from flowing into the gate electrode of the driving transistor T1 while reducing power consumption.

Figure 5A:
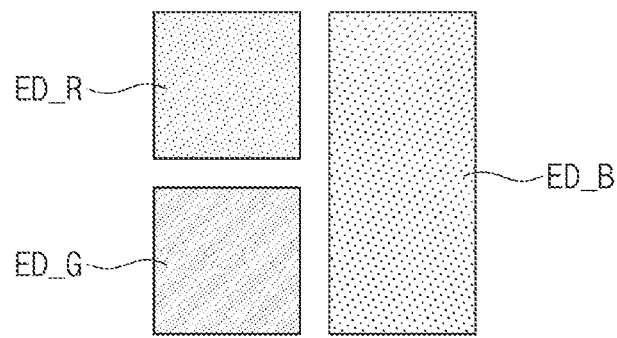
FIGS. 5A to 5C are plan views illustrating the arrangement structure of pixels according to embodiments of the present disclosure.
Figure 5A:
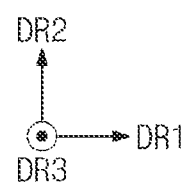
Figure 5B:
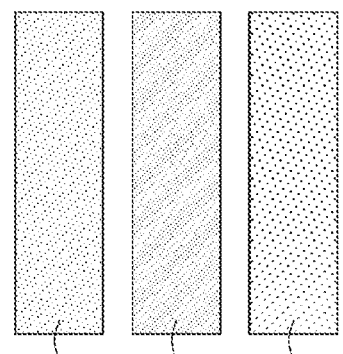
Figure 5B:
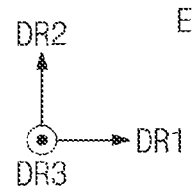
Figure 5C:
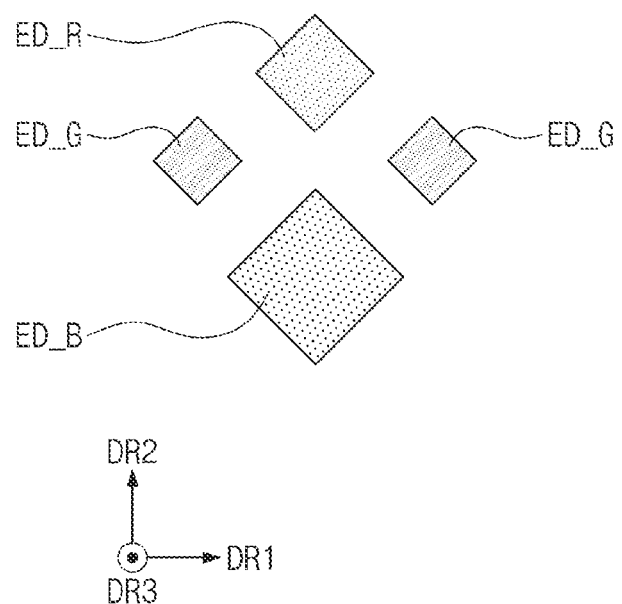

FIGS. 5A to 5C are plan views illustrating an arrangement structure of pixels according to embodiments of the present disclosure.

Referring to FIG. 5A, light emitting elements may include a first light emitting element ED_R to emit first light (e.g., red light), a second light emitting element ED_G to emit second light (e.g., green line), and a third light emitting element ED_B to emit third light (e.g., blue light). One of the first to third light emitting elements ED_R, ED_G, and ED_B may correspond to one pixel PX (see FIG. 4A). The first to third light emitting elements ED_R, ED_G, and ED_B may form one light emitting element unit. In the display panel DP (see FIG. 4A), the light emitting element units may be repeatedly arranged in the first and second directions DR1 and DR2.

According to an embodiment of the present disclosure, the first light emitting element ED_R and the second light emitting element ED_G are arranged in the second direction DR2, and the third light emitting element ED_B is disposed to be adjacent to each of the first light emitting element ED_R and the second light emitting element ED_G in the first direction DR1. Alternatively, the first light emitting element ED_R and the second light emitting element ED_G may be arranged in a direction inclined with respect to the second direction DR2. In addition, the third light emitting element ED_B may be disposed to be overlapped with the first light emitting element ED_R and the second light emitting element ED_G in the first direction DR1.

Although FIG. 5A illustrates that the first light emitting element ED_R and the second light emitting element ED_G have the same size, the present disclosure is not limited thereto. For example, the first light emitting element ED_R and the second light emitting element ED_G may have different sizes. The third light emitting element ED_B may have a size larger than the size of the first and second light emitting elements ED_R and ED_G. However, the size, the shape, or the arrangement of the first to third light emitting elements ED_R, ED_G, and ED_B may be various modified.

As illustrated in FIG. 5B, the first to third light emitting elements ED_R, ED_G, and ED_B may be sequentially arranged in the first direction DR1. Each of the first to third light emitting elements ED_R, ED_G, and ED_B may have a stripe structure extending in the second direction DR2. In this case, the areas of the first to third light emitting elements ED_R, ED_G, and ED_B may be equal to each other, but embodiments are not limited thereto.

Alternatively, as illustrated in FIG. 5C, the first to third light emitting elements ED_R, ED_G, and ED_B may be arranged in the form of pentile (PENTILE™). Specifically, one first light emitting element ED_R, two second light emitting elements ED_G, and one third light emitting element ED_B may form one light emitting element unit. Each of the first to third light emitting elements ED_R, ED_G, and ED_B may have a rhombus shape. According to an embodiment, the areas of the second light emitting elements ED_G may be smaller than the area of the first and third light emitting elements ED_R and ED_B, but embodiment are not limited thereto.

Figure 6A:
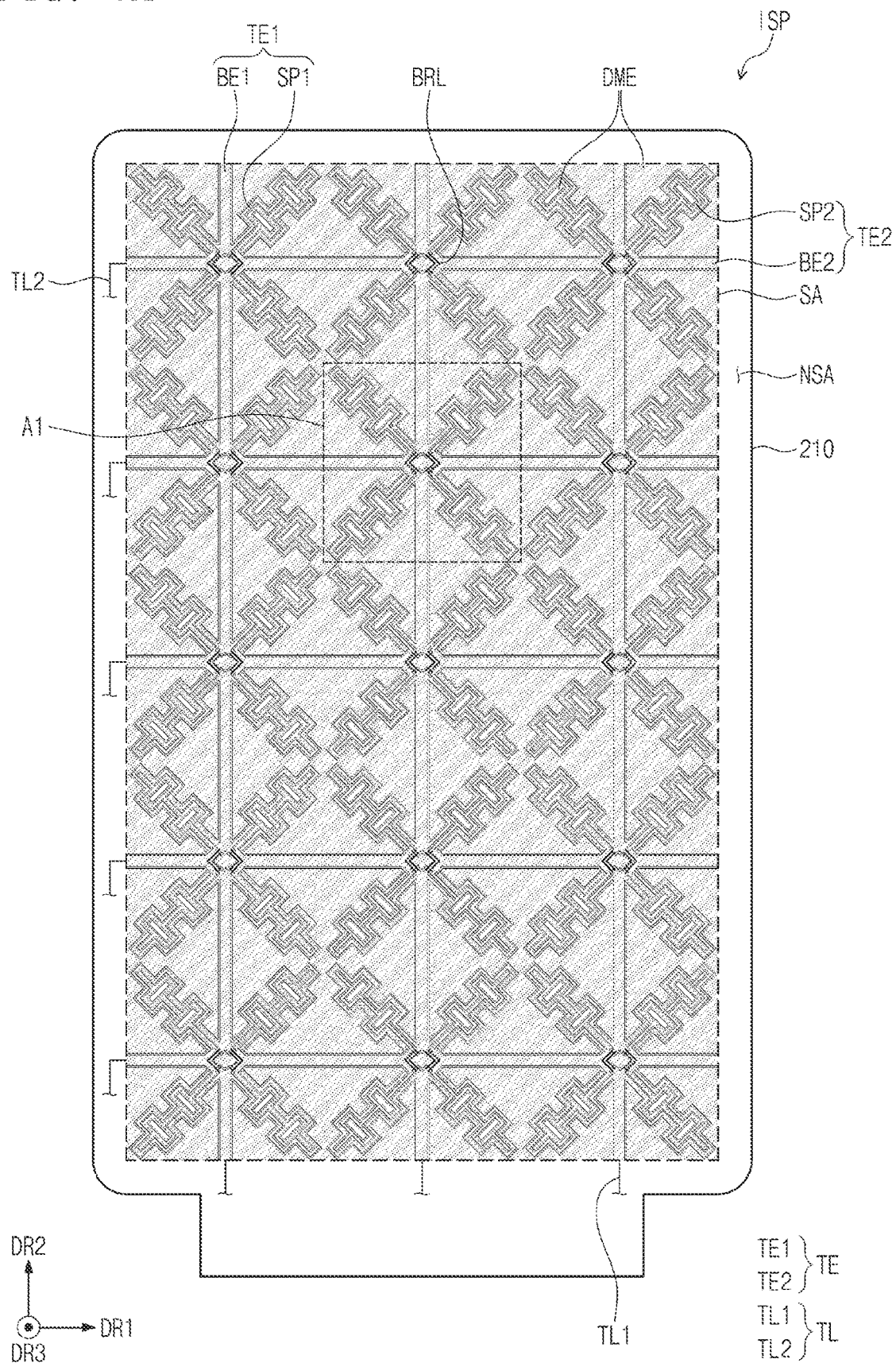
FIG. 6A is a plan view illustrating an input sensing layer according to an embodiment of the present disclosure.
Figure 6B:
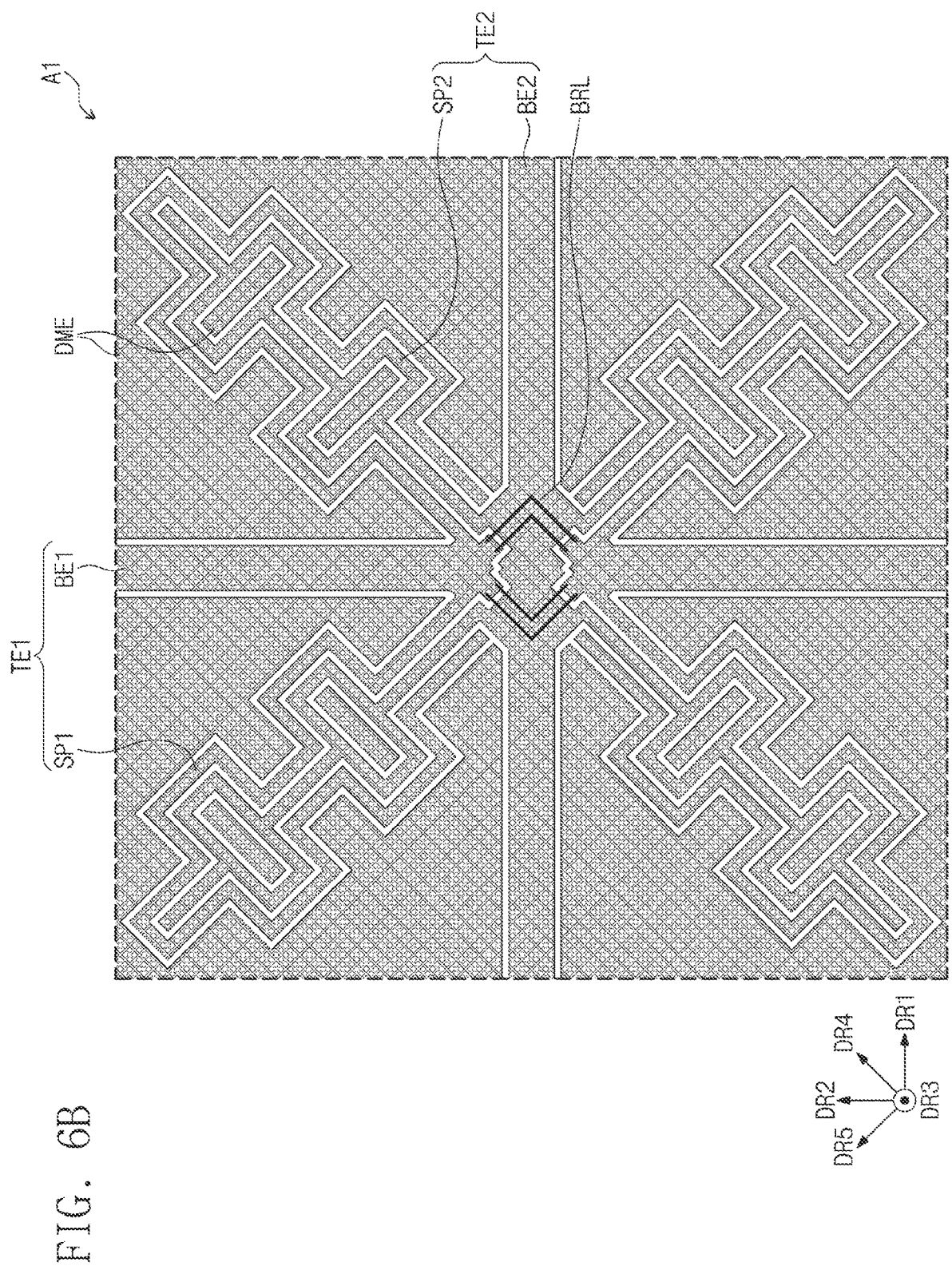
FIG. 6B is an enlarged view illustrating a part of an input sensing layer illustrated in FIG. 6A.

FIG. 6A is a plan view of an input sensing layer according to an embodiment of the present disclosure, and FIG. 6B is an enlarged view of a part A1 of the input sensing layer illustrated in FIG. 6A.

Referring to FIGS. 6A and 6B, the input sensing layer ISP may be divided into a sensing region SA and a non-sensing region NSA adjacent to the sensing region SA. The sensing region SA and the non-sensing region NSA of the input sensing layer ISP may correspond to the active region AA (see FIG. 4A) and the non-active region NAA (see FIG. 4A) of the display panel (DP, see FIG. 4A), respectively. In other words, the sensing region SA of the input sensing layer ISP may be a region that overlaps the active region AA in which the light emitting elements ED (see FIG. 4B) of the plurality of pixels PX (see FIG. 4A) are disposed.

According to an embodiment, the input sensing layer ISP may include a plurality of sensing electrodes TE, a plurality of trace lines TL connected to the plurality of sensing electrodes TE, and a plurality of sensing pads. One side ends of a plurality of the trace lines TL may be connected to the plurality of sensing electrodes TE, and opposite side ends of the plurality of trace lines TL may be connected to the plurality of sensing pads.

The plurality of sensing electrodes TE may include a plurality of first sensing electrodes TE1 and a plurality of second sensing electrodes TE2. Each of the plurality of first sensing electrodes TE1 may include a plurality of first base parts BE1 and a plurality of first sensing parts SP1. The plurality of first base parts BE1 may extend in the second direction DR2 and may be provided in a plurality of columns arranged in the first direction DR1. The plurality of first sensing parts SP1 may extend in a direction (for example, a fourth direction DR4 or a fifth direction DR5) inclined with respect to the first direction DR1 and the second direction DR2 from the plurality of first base parts BE1. For example, the first sensing parts SP1 may extend in a diagonal direction. According to an embodiment, the plurality of first sensing parts SP1 and the plurality of first base parts BE1 have an integral pattern formed through the same process. For example, a single first continuous layer may be used to form the plurality of first sensing parts SP1 and the plurality of first base parts BE1.

The plurality of second sensing electrodes TE2 may include a plurality of second base parts BE2 and a plurality of second sensing parts SP2. The plurality of second base parts BE2 may extend in the first direction DR1 and may be provided in a plurality of rows arranged in the second direction DR2. The plurality of second sensing parts SP2 may extend in a direction (for example, the fourth direction DR4 or the fifth direction DR5) inclined with respect to the first direction DR1 and the second direction DR2 from the plurality of second base parts BE2. For example, the plurality of second sensing parts SP2 may extend in a diagonal direction. According to an embodiment, the plurality of second sensing parts SP2 and the plurality of second base parts BE2 have an integral pattern formed through the same process. For example, a single second continuous layer may be used to form the plurality of second sensing parts SP2 and the plurality of first base parts BE2, where the single second continuous layer is separate from the single first continuous layer.

The first base parts BE1 may be spaced apart from each other in the second direction DR2 while interposing the second base parts BE2 at a crossing part between the first base parts BE1 and the second base parts BE2. The input sensing layer ISP may further include a bridge electrode BRL to connect the first base parts BE1 spaced apart from each other in the second direction DR2.

The plurality of first sensing parts SP1 and the plurality of second sensing parts SP2 may be adjacent to each other, but may be spaced apart from each other to be electrically insulated from each other. The plurality of first sensing parts SP1 may form mutual capacitors with the plurality of second sensing parts SP2.

In an embodiment, the input sensing layer ISP further includes a dummy electrode DME disposed not to overlap with the first and second sensing electrodes TE1 and TE2. In an embodiment, the dummy electrode DME is located at a position which does not overlap with the first and second sensing electrodes TE1 and TE2, when viewed on a plane (that is, when viewed in the third direction).

As illustrated in FIG. 6B, the first sensing electrodes TE1 and the second sensing electrodes TE2 may include a plurality of mesh lines crossing each other, and may have a mesh shape in which a plurality of openings are defined. According to an embodiment, the first and second base parts BE1 and BE2, and the first and second sensing parts SP1 and SP2 may have the mesh shape. According to an embodiment, since each of the first sensing electrodes TE1 and the second sensing electrodes TE2 has a mesh structure, a parasitic capacitance by a parasitic capacitor formed between the first sensing electrodes TE1 and the second electrode CE (see FIG. 4A) of the light emitting element ED (see FIG. 4B), and a parasitic capacitance by a parasitic capacitor formed between the second sensing electrodes TE2 and the second electrode CE may be reduced, when compared to when the plurality of first sensing electrodes TE1 and the plurality of second sensing electrodes TE2 have a plate electrode shape without an opening.

In addition, to further reduce the parasitic capacitance, the dummy electrodes DME are provided to be adjacent to the first sensing electrodes TE1 and the second sensing electrodes TE2. The dummy electrodes DME may be surrounded by a closed loop formed by removing some of the mesh lines, which constitute the first sensing electrodes TE1 and the second sensing electrodes TE2, and may be electrically insulated from the first sensing electrodes TE1 and the second sensing electrodes TE2. In an embodiment, the closed loop is not electrically connected to or electrically isolated from the dummy electrode DME that it surrounds. The dummy electrodes DME may have a mesh shape including a plurality of dummy mesh lines crossing each other, and a plurality of dummy openings defined by the plurality of dummy mesh lines.

The dummy electrodes DME may be electrically connected to the second electrode CE of the light emitting element ED provided in the display panel DP. Hereinafter, a connection structure between the dummy electrode DME and the second electrode CE will be described in more detail with reference to FIG. 7.

Figure 7:
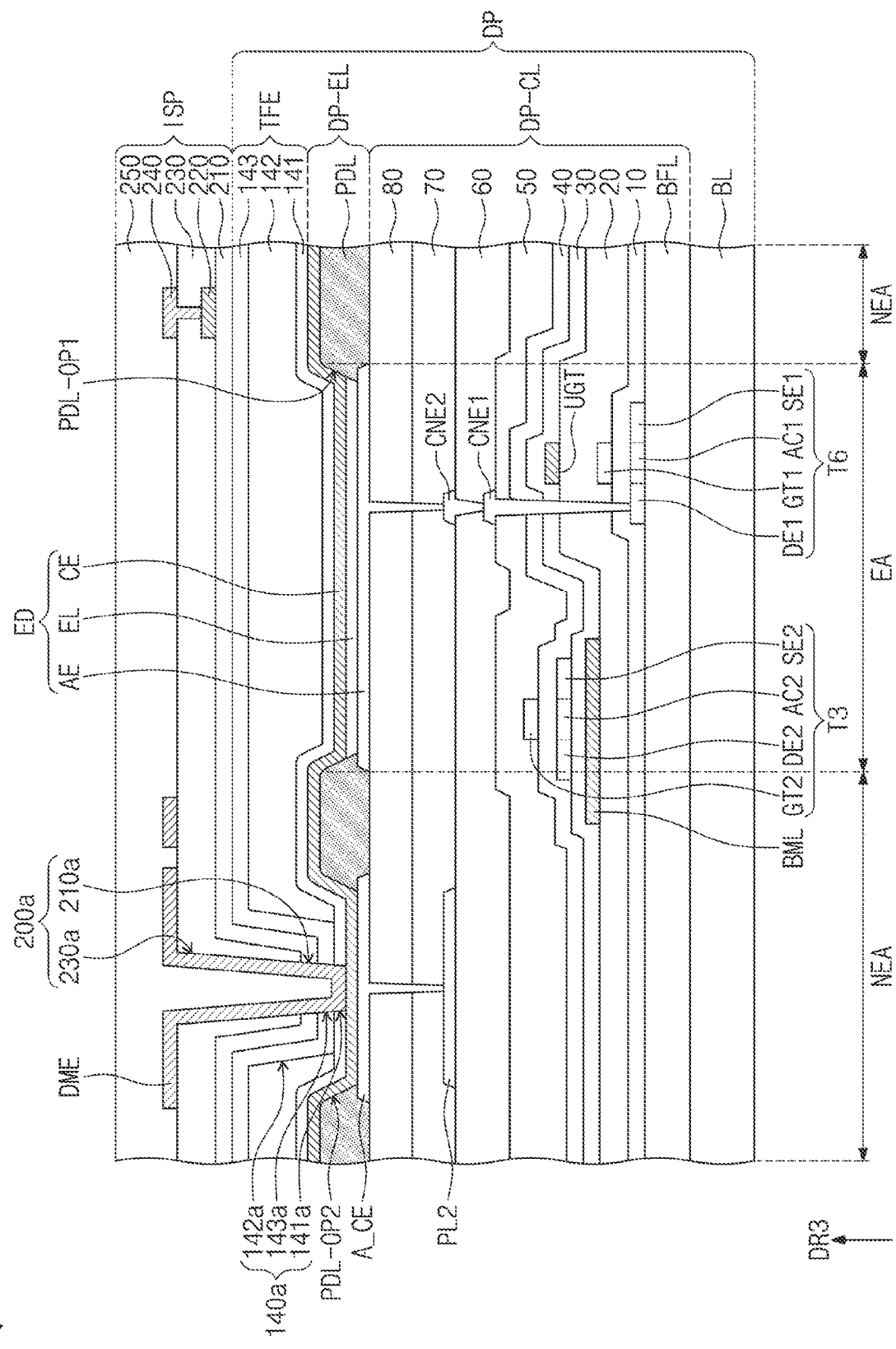
FIG. 7 is a cross-sectional view illustrating a part of a display module according to an embodiment of the present disclose.

FIG. 7 is a cross-sectional view illustrating a portion of a display module according to an embodiment of the present disclose.

Referring to FIG. 7, the display module DM may include the display panel DP and the input sensing layer ISP directly disposed on the display panel DP. The display panel DP may include the base layer BL, the circuit element layer DP-CL, the light emitting element layer DP-EL, and the encapsulation layer TFE.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, and a signal line. The insulating layer, the semiconductor layer, and the conductive layer may be formed on the base layer BL through a coating scheme or a deposition scheme. The insulating layer, the semiconductor layer, and the conductive layer may be selectively patterned through a plurality of photolithography processes. Thereafter, the semiconductor pattern, the conductive pattern, and the signal line included in the circuit element layer DP-CL may be formed.

At least one buffer layer BFL is formed on the top surface of the base layer BL. According to an embodiment, the display panel DP is illustrated as including one buffer layer BFL. The buffer layer BFL may improve coupling force between the base layer BL and the semiconductor pattern. The buffer layer BFL may include a silicon oxide layer and a silicon nitride layer, and the silicon oxide layer and the silicon nitride layer may be alternately stacked.

A first semiconductor pattern may be disposed on the buffer layer BFL. The first semiconductor pattern may include polysilicon. However, the present disclosure is not limited thereto. For example, the semiconductor pattern may include amorphous silicon or metal oxide.

While FIG. 7 only illustrates a first semiconductor pattern disposed in a partial region, the first semiconductor pattern may be further disposed in another region. The first semiconductor pattern may be arranged according to a specific rule over the pixels. The first semiconductor pattern may have different electric al properties depending on whether the first semiconductor pattern is doped. The first semiconductor pattern may include a first region having higher conductivity and a second region having lower conductivity. The first region may be doped with N-type dopants or P-type dopants. The P-type transistor includes a doping region doped with P-type dopants. The second region may be a non-doped region or may be doped at a lower concentration than that of the first region.

The first region may have a conductivity greater than that of the second region, and may serve as an electrode or a signal line. The second region may correspond to a channel region of a transistor. In other words, a portion of the first semiconductor pattern may be the channel region of the transistor, and another portion of the semiconductor pattern may be a source region or a drain region of the transistor.

FIG. 7 illustrates the compensation transistor T3 and the second control transistor T6 of the pixel driving circuit PC (see FIG. 4B), and the light emitting element ED.

A source region SE1, a channel region AC1, and a drain region DE1 of the second control transistor T6 may be formed from the first semiconductor pattern. The source region SE1 and the drain region DE1 may extend in directions opposite to each other from the channel region AC1, when viewed in a cross-sectional view.

A first insulating layer 10 may be disposed on the buffer layer BFL. The first insulating layer 10 may overlap with a plurality of pixels PX in common and may cover the first semiconductor pattern. The first insulating layer 10 may be an inorganic layer and/or an organic layer, and may have a single-layer or multi-layer structure. The first insulating layer 10 may include at least one of aluminum oxide, titanium oxide, silicon oxide, silicon nitride, silicon oxynitride, zirconium oxide, or hafnium oxide. According to an embodiment, the first insulating layer 10 may be a single silicon oxide layer. The first insulating layer 10 and an insulating layer of the circuit element layer DP-CL, which is to be described later, may be an inorganic layer and/or an organic layer, and may have a single-layer structure or a multi-layer structure. The inorganic layer may include at least one of the materials described above, but the present disclosure is not limited thereto.

A gate electrode GT1 of the second control transistor T6 is disposed on the first insulating layer 10. The gate electrode GT1 may be a portion of a metal pattern. The gate electrode GT1 may overlap with the channel region AC1. The gate electrode GT1 may function as a mask in a process of doping the second semiconductor pattern.

A second insulating layer 20 may be disposed on the first insulating layer 10 and may cover the gate electrode GT1. The second insulating layer 20 may overlap with the pixels in common. The second insulating layer 20 may be an inorganic layer and/or an organic layer, and may have a single-layer or multi-layer structure. According to an embodiment, the second insulating layer 20 may be a single silicon oxide layer.

An upper gate electrode UGT of the second control transistor T6 is disposed on the second insulating layer 20. The upper gate electrode UGT may be a portion of a metal pattern. The upper gate electrode UGT overlaps with the gate electrode GT1 of the second control transistor T6.

A third insulating layer 30 may be disposed on the second insulating layer 20. The third insulating layer 30 may be commonly provided in a plurality of pixels PX and cover the upper gate electrode UGT. For example, the third insulating layer 30 may commonly cover the upper gate electrode UGT of several pixels PX. The third insulating layer 30 may have a single-layer or multi-layer structure. For example, the third insulating layer 30 may have a multi-layer structure including a silicon oxide layer and a silicon nitride layer. A bottom metal layer BML may be interposed between the second insulating layer 20 and the third insulating layer 30. The bottom metal layer BML may receive a constant voltage or a signal. The bottom metal layer BML may be disposed on the same layer as the upper gate electrode UGT of the second control transistor T6.

A second semiconductor pattern may be disposed on the third insulating layer 30. The second semiconductor pattern may include an oxide semiconductor. The oxide semiconductor may include a plurality of regions that are distinguished from one another depending on whether the metal oxide is reduced. A region (hereinafter referred to as a "reduction region"), in which the metal oxide is reduced, has higher conductivity than a region (hereinafter referred to as a "non-reduction region") in which the metal oxide is not reduced. The reduction region may serve as a source region/drain region of the transistor or a signal line. The non-reduction region may correspond to a channel region of a transistor. In other words, a portion of the second semiconductor pattern may be a panel region of a transistor, another portion of the second semiconductor pattern may be a source region or a drain region of the transistor, and still another portion may be a signal transmission region.

A source region SE2, a channel region AC2, and a drain region DE2 of the compensation transistor T3 may be formed from the second semiconductor pattern. The source region SE2 and the drain region DE2 may extend in directions opposite to each other from the channel region AC2, when viewed in a cross-sectional view.

A fourth insulating layer 40 may be disposed on the third insulating layer 30. The fourth insulating layer 40 may commonly overlap with a plurality of pixels PX and may cover the second semiconductor pattern. The fourth insulating layer 40 may include at least one of aluminum oxide, titanium oxide, silicon oxide, silicon nitride, silicon oxynitride, zirconium oxide, or hafnium oxide.

A gate electrode GT2 of the compensation transistor T3 is disposed on the fourth insulating layer 40. The gate electrode GT2 may be a portion of a metal pattern. The gate electrode GT2 may overlap with the channel region AC2. The gate electrode GT2 may function as a mask in a process of doping the second semiconductor pattern.

A fifth insulating layer 50 may be disposed on the fourth insulating layer 40 and may cover the gate electrode GT2. The fifth insulating layer 50 may be an inorganic layer and/or an organic layer, and may have a single-layer or multi-layer structure.

A first connection electrode CNE1 may be disposed on the fifth insulating layer 50. The first connection electrode CNE1 may be connected to the drain region DE1 of the second control transistor T6 through a contact hole formed through the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole formed through the sixth insulating layer 60.

According to an embodiment of the present disclosure, the second power line PL2 may be disposed on the sixth insulating layer 60. In other words, the second power line PL2 may be disposed on the same layer as the second connection electrode CNE2. However, the present disclosure is not limited thereto. Alternatively, the second power line PL2 may be disposed on the same layer as the first connection electrode CNE1. For example, the second power line PL2 may be disposed on the fifth insulating layer 50.

A seventh insulating layer 70 may be disposed on the sixth insulating layer 60 and may cover the second connection electrode CNE2 and the second power line PL2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include general purpose polymers such as Benzocyclobutene (BCB), polyimide, Hexamethyldisiloxane (HMDSO), Polymethylmethacrylate (PMMA) or Polystyrene (PS), a polymer derivative having a phenolic group, an acrylic polymer, an imide-based polymer, an acryl ether polymer, an amide-based polymer, a fluorine-based polymer, a p-xylene-based polymer, a vinyl alcohol-based polymer, and the blend thereof.

The light emitting element layer DP-EL including the light emitting element ED may be disposed on the circuit element layer DP-CL. The light emitting element ED may include a first electrode AE, a light emitting layer EL, and the second electrode CE. The second electrode CE may be connected to the pixels PX (see FIG. 4A) to be provided in common. For example, the second electrode CE may be commonly connected to several pixels PX.

The first electrode AE may be disposed on the eighth insulating layer 80. The first electrode AE may be a transmissive electrode, a semi-transmissive electrode, or a reflective electrode. According to an embodiment, the first electrode AE may include a reflective layer formed of Ag, Mg, Al, Pt, Pd, Au, Ni, Nd, Jr, Cr, or a compound thereof, and a transparent electrode layer or a translucent electrode layer formed on the reflective layer. The transparent electrode layer or translucent electrode layer may include at least one selected from the group consisting of an indium tin oxide (ITO), indium zinc oxide (IZO), indium gallium zinc oxide (IGZO), zinc oxide (ZnO), indium oxide (In2O3), and aluminum-doped zinc oxide (AZO). For example, the first electrode AE may include ITO/Ag/ITO.

An auxiliary electrode A_CE may be disposed on the eighth insulating layer 80. The auxiliary electrode A_CE may be connected to the second power line PL2 through a contact hole formed through the seventh insulating layer 70 and the eighth insulating layer 80.

A pixel defining layer PDL may be disposed on the eighth insulating layer 80. The pixel defining layer PDL may have a property of absorbing light. For example, the pixel defining layer PDL may have a black color. The pixel defining layer PDL may include a black coloring agent. The black coloring agent may include a black dye and a black pigment. The black coloring agent may include a metal, such as carbon black or chromium, or an oxide thereof.

The pixel defining layer PDL may cover a portion of the first electrode AE. For example, the pixel defining layer PDL may cover an end portion of the first electrode AE. For example, a pixel opening PDL-OP1 exposing a portion of the first electrode AE may be defined in the pixel defining layer PDL. A region, which overlaps with the pixel opening PDL-OP1, in the display panel DP may be defined as a light emitting region EA, and a remaining region of the display panel DP may be defined as a non-light emitting region NEA. The light emitting element ED may be provided to correspond to the light emitting region EA.

According to an embodiment of the present disclosure, the pixel defining layer PDL may cover a portion of the auxiliary electrode A_CE. For example, the pixel defining layer PDL may cover an end portion of the auxiliary electrode A_CE. For example, an auxiliary opening PDL-OP2 exposing a portion of the auxiliary electrode A_CE may be defined in the pixel defining layer PDL. The auxiliary opening PDL-OP2 may be provided in the non-light emitting region NEA.

The light emitting layer EL may be disposed on the first electrode AE. According to the present embodiment, the light emitting layer EL may output light of at least one color of blue, red, and green.

The second electrode CE may be disposed on the light emitting layer EL. The second electrode CE may be commonly formed with respect to the plurality of pixels PX (see FIG. 4A) by using an open mask. The second electrode CE may be connected to the auxiliary electrode A_CE exposed through the auxiliary opening PDL-OP2 in the non-light emitting region NEA.

A hole control layer may be interposed between the first electrode AE and the light emitting layer EL. The hole control layer may include a hole transport layer and may further include a hole injection layer. An electron control layer may be interposed between the light emitting layer EL and the second electrode CE. The electron control layer may include an electron transport layer, and may further include an electron injection layer. The hole control layer and the electron control layer may be formed, in common, in the plurality of pixels PX (see FIG. 4A) by using an open mask.

The encapsulation layer TFE may be disposed on the light emitting element layer DP-EL. The encapsulation layer TFE may include a first encapsulation inorganic layer 141, an encapsulation organic layer 142, and a second encapsulation inorganic layer 143, which are sequentially stacked, but layers constituting the encapsulation layer TFE are not limited thereto.

The first and second encapsulation inorganic layers 141 and 143 may protect the light emitting element layer DP-EL from moisture and oxygen, and the encapsulation organic layer 142 may protect the light emitting element layer DP-EL from foreign substances such as dust particles. The first and second encapsulation inorganic layers 141 and 143 may include a silicon nitride layer, a silicon oxynitride layer, a silicon oxide layer, a titanium oxide layer, or an aluminum oxide layer. The encapsulation organic layer 142 may include, but is not limited to, an acrylic organic layer.

According to an embodiment of the present disclosure, the encapsulation layer TFE includes a contact hole 140a to expose the second electrode CE of the light emitting element ED. The contact hole 140a may include a first contact hole 142a provided in the encapsulation organic layer 142, and second and third contact holes 141a and 143a provided in the first and second encapsulation inorganic layers 141 and 143, respectively. For example, the first contact hole 142a may be a through-hole of the encapsulation organic layer 142, the second contact hole 141a may be a through-hole of the first encapsulation inorganic layer 141 and the third contact hole 143a may be a through-hole of the second encapsulation inorganic layer 143. The contact hole 140a may overlap with the auxiliary opening PDL-OP2 of the pixel defining layer PDL, when viewed in a plan view (in other words, when viewed in the third direction DR3). According to an embodiment of the present disclosure, the size of the auxiliary opening PDL-OP2 is greater than the size of the contact hole 140a. Accordingly, the contact hole 140a may be provided in the auxiliary opening PDL-OP2.

The input sensing layer ISP may be disposed on the display panel DP. The input sensing layer ISP may also be referred to as an input sensor or an input sensing panel. The input sensing layer ISP may include an insulating base layer 210, a first conductive layer 220, a sensing insulating layer 230, a second conductive layer 240, and a protective layer 250.

The insulating base layer 210 may be directly disposed on the display panel DP. The insulating base layer 210 may be an inorganic layer including at least one of silicon nitride, silicon oxynitride, and silicon oxide. Alternatively, the insulating base layer 210 may be an organic layer including an epoxy resin, an acrylate resin, or an imide-based resin. The insulating base layer 210 may have a single-layer structure or may have a multi-layer structure stacked in the third direction DR3.

Each of the first conductive layer 220 and the second conductive layer 240 may have a single-layer structure or a multi-layer structure stacked in the third direction DR3.

A conductive layer in the single-layer structure may include a metal layer or a transparent conductive layer. The metal layer may include molybdenum, silver, titanium, copper, aluminum, or the alloy thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include conductive polymer, such as PEDOT, a metal nano-wire, or graphene.

A conductive layer in the multi-layer structure may include metal layers. The metal layers may, for example, have a three-layer structure of titanium/aluminum/titanium. The conductive layer of the multi-layer structure may include at least one metal layer and at least one transparent conductive layer.

The first conductive layer 220 may include the bridge electrode BRL illustrated in FIGS. 6A and 6B. For example, the bridge electrode BRL may be part of the first conductive layer 220. The second conductive layer 240 may include the first and second base parts BE1 and BE2, the first and second sensing parts SP1 and SP2, and the dummy electrode DME illustrated in FIGS. 6A and 6B. For example, the first base part BE1 may be a first part of the second conductive layer 240, the second base part BE2 may be a second part of the second conductive layer 240, the first sensing part SP1 may be a third part of the second conductive layer 240, the second sensing part SP2 may be a fourth part of the second conductive layer 240, and the dummy electrode DME may be a fifth part of the second conductive layer 240 that is not electrically connected to the first through fourth parts.

The sensing insulating layer 230 may be interposed between the first conductive layer 220 and the second conductive layer 240, and the protective layer 250 may be disposed to cover the second conductive layer 240 and the sensing insulating layer 230. The sensing insulating layer 230 and the protective layer 250 may include an inorganic layer. The inorganic layer may include at least one of an aluminum oxide, a titanium oxide, a silicon oxide, a silicon nitride, a silicon oxynitride, a zirconium oxide, or a hafnium oxide.

A sensing contact hole may be located in the sensing insulating layer 230 to connect the first base part BE1 to the bridge electrode BRL. The sensing insulating layer 230 and the protective layer 250 may include an organic layer. The organic layer may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

In addition, a dummy contact hole 200a to expose the second electrode CE of the light emitting element ED may be located in the input sensing layer ISP. Specifically, the dummy contact hole 200a may include a first dummy contact hole 210a located in the insulating base layer 210 and a second dummy contact hole 230a located in the sensing insulating layer 230. For example, the first dummy contact hole 210a may be a through-hole of the insulating base layer 210 and the second dummy contact hole 230a may be a through-hole of the sensing insulating layer 230. The dummy contact hole 200a may overlap with the auxiliary opening PDL-OP2 of the pixel defining layer PDL, when viewed in a plan view (in other words, when viewed in the third direction DR3). According to an embodiment of the present disclosure, the size of the auxiliary opening PDL-OP2 is greater than the size of the dummy contact hole 200a. Accordingly, the dummy contact hole 200a may be provided in the auxiliary opening PDL-OP2.

The dummy electrode DME may be connected to the second electrode CE of the light emitting element ED through the dummy contact hole 200a located in the input sensing layer ISP and the contact hole 140a located in the encapsulation layer TFE. The dummy electrode DME may be directly connected to (or directly make contact with) the second electrode CE of the light emitting element ED. In an embodiment, a resistivity of the dummy electrode DME is less than or equal to that of the second electrode CE of the light emitting element ED. For example, the second conductive layer 240 may have a resistivity of approximately 0.12.

As described above, the voltage drop of the second driving voltage ELVSS (see FIG. 4B) applied to the second electrode CE may be compensated or removed through the dummy electrode DME by electrically connecting the dummy electrode DME provided in the input sensing layer ISP to the second electrode CE of the light emitting elements ED. Accordingly, a uniform second driving voltage ELVSS may be applied to the light emitting elements ED, thereby increasing the uniformity in the whole brightness of the display device DD.

Figure 8A:
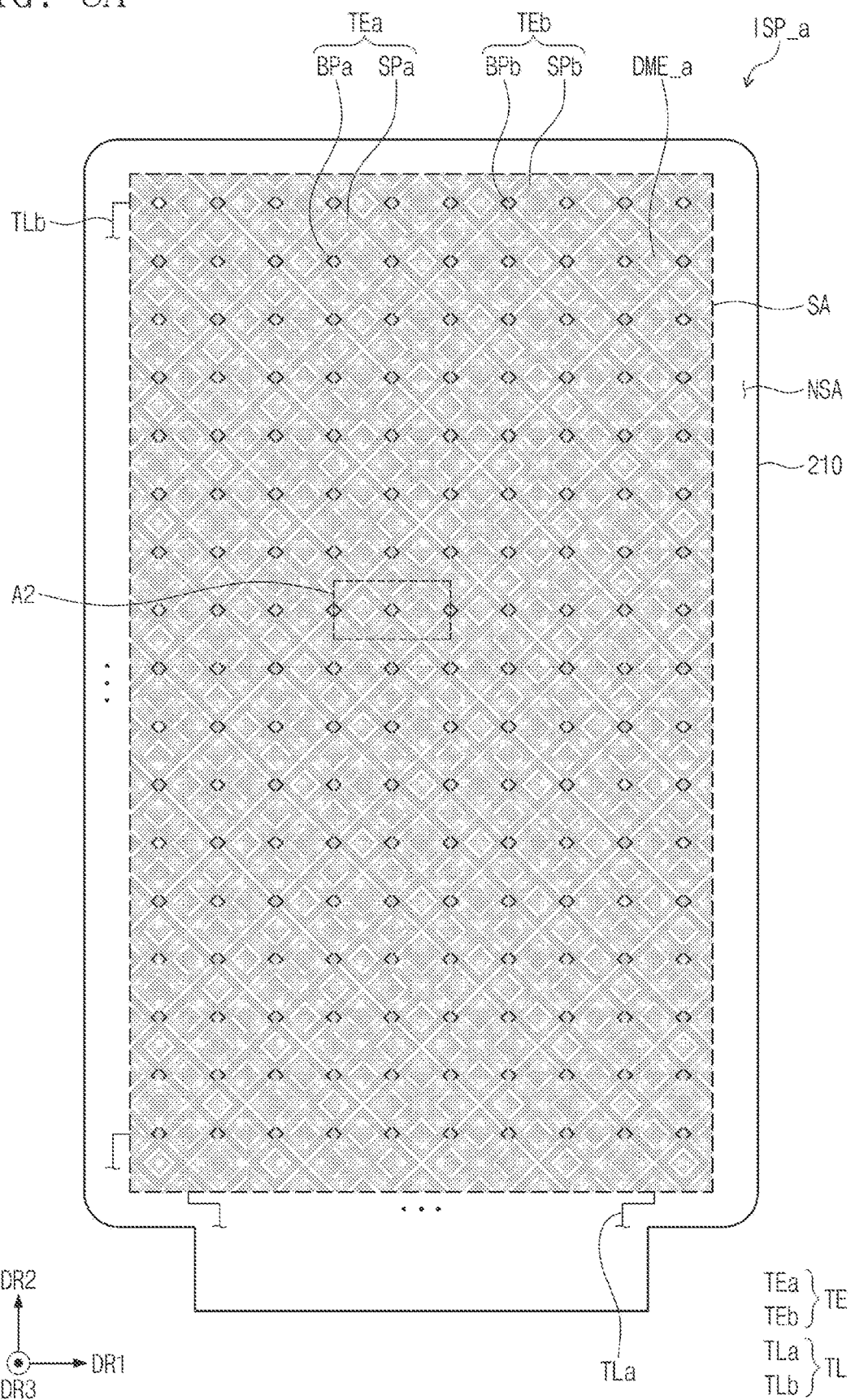
FIG. 8A is a plan view illustrating an input sensing layer according to an embodiment of the present disclosure.
Figure 8B:
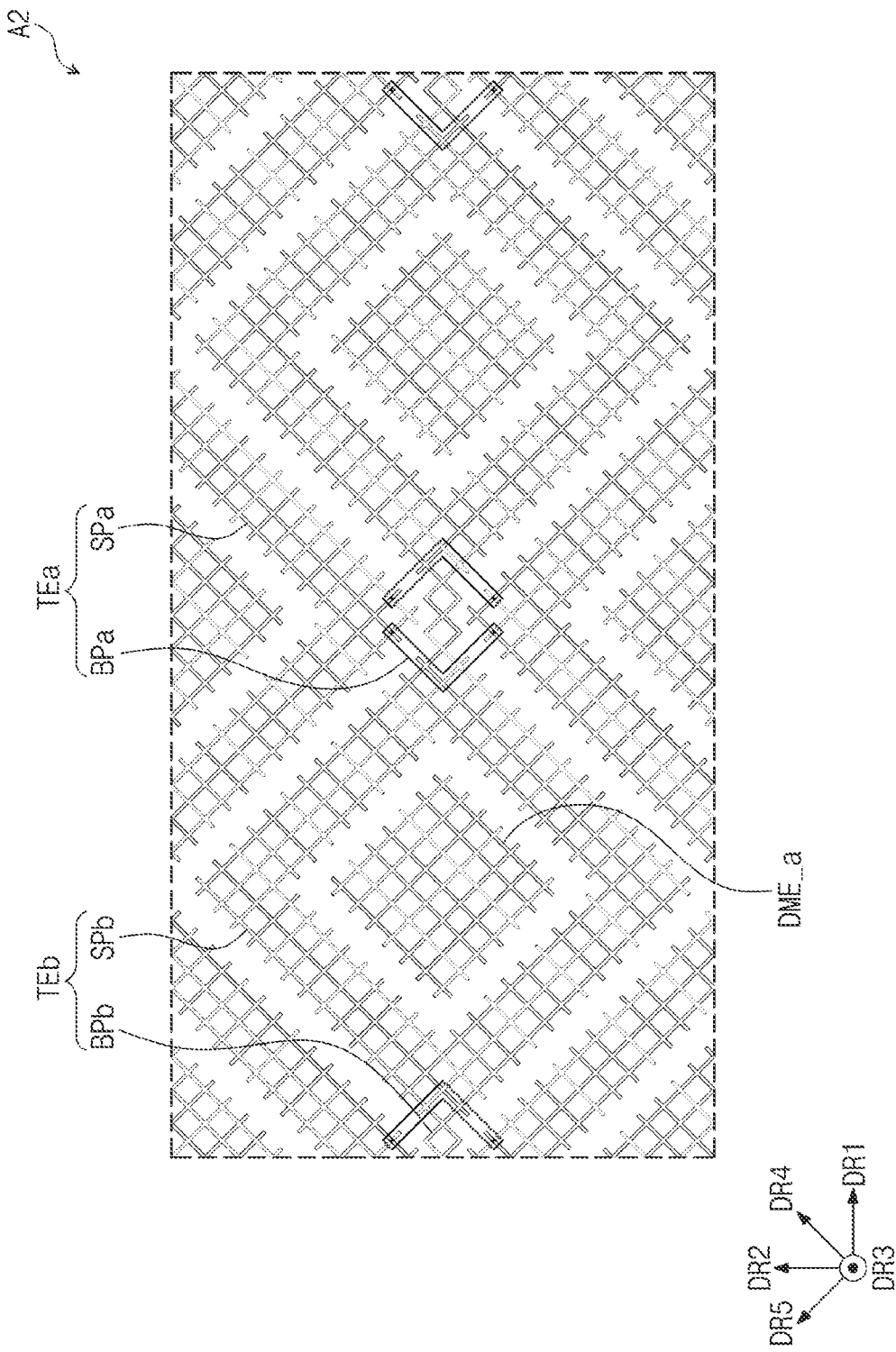
FIG. 8B is an enlarged view illustrating a part of an input sensing layer illustrated in FIG. 8A.

FIG. 8A is a plan view of an input sensing layer according to an embodiment of the present disclosure, and FIG. 8B is an enlarged view of a part A2 of the input sensing layer illustrated in FIG. 8A.

Referring to FIGS. 8A and 8B, an input sensing layer ISP_a may be divided into the sensing region SA and the non-sensing region NSA adjacent to the sensing region SA. The sensing region SA and the non-sensing region NSA of the input sensing layer ISP_a may correspond to the active region AA (see FIG. 4A) and the non-active region NAA (see FIG. 4A) of the display panel DP (see FIG. 4A), respectively. The input sensing layer ISP of FIG. 6 may be implemented by the input sensing layer ISP_a.

According to an embodiment, the input sensing layer ISP_a may include a plurality of sensing electrodes TE, a plurality of trace lines TL connected to the plurality of sensing electrodes TE, and a plurality of sensing pads. One ends of a plurality of trace lines TL may be connected to the plurality of sensing electrodes TE, and opposite ends of the plurality of trace lines TL may be connected to the plurality of sensing pads.

According to an embodiment of the present disclosure, the plurality of sensing electrodes TE may include a plurality of first sensing electrodes TEa and a plurality of second sensing electrodes TEb. The plurality of trace lines TL may include a plurality of first trace lines TLa connected to a plurality of first sensing electrodes TEa and a plurality of second trace lines TLb connected to a plurality of second sensing electrodes TEb.

Each of the plurality of first sensing electrodes TEa may include a plurality of first sensing parts SPa. The plurality of first sensing parts SPa may be arranged in the second direction DR2 and disposed to be spaced apart from each other. Each of the plurality of second sensing electrodes TEb may include a plurality of second sensing parts SPb. The plurality of second sensing parts SPb may be arranged in the first direction DR1 and may be spaced apart from each other. Each of a plurality of first and second sensing parts SPa and SPb may have a rhombus shape. However, this is illustrated as an example, and shapes of a plurality of first and second sensing parts SPa and SPb are not particularly limited.

Each of the plurality of first sensing electrodes TEa may further include bridge parts BPa connecting the plurality of first sensing parts SPa. According to an embodiment of the present disclosure, the bridge parts BPa are provided at a layer different from the layer of the plurality of first sensing parts SPa. Accordingly, the bridge parts BPa may not be integrated with the plurality of first sensing parts SPa. For example, the bridge part BPa and the first sensing part SPa may be formed from separate layers. Each of the plurality of second sensing electrodes TEb may include connection parts BPb to connect the plurality of second sensing parts SPb to each other. The connection parts BPb may extend from the plurality of second sensing parts SPb to be integrated with the plurality of second sensing parts SPb. For example, the connection parts BPb and the second sensing part SPb may be formed from a single unitary layer.

Dummy electrodes DME_a are disposed to be spaced apart from the first sensing electrodes TEa and the second sensing electrodes TEb. Accordingly, the dummy electrodes DME_a may be electrically isolated from the first sensing electrodes TEa and the second sensing electrodes TEb.

Each of the dummy electrodes DME_a may be surrounded by one first sensing part SPa or one second sensing part SPb, when viewed in a plan view. For example, each of the first sensing parts SPa and the second sensing parts SPb has a rhombus shape and an empty space may be formed in a central region of the rhombus. In this case, the dummy electrodes DME_a may be disposed in the empty space and may be electrically insulated from the first sensing parts SPa and the second sensing parts SPb. For example, empty space or an insulating layer may be present between an outer surface of the dummy electrode DME_a and an inner surface of a sensing part (e.g., SPa or SPb) surrounding the dummy electrode DME_a. In embodiment, the sensing part is not connected to or is electrically isolated from the dummy electrode_a that it surrounds.

When the dummy electrodes DME_a are disposed in an empty space formed in the first sensing parts SPa and the second sensing patterns SPb, the shapes of the first sensing parts SPa and the second sensing patterns SPb may be prevented from being viewed from the outside. In addition, the dummy electrodes DME_a may reduce a parasitic capacitance generated between the first sensing parts SPa and the second sensing parts SPb and the second electrode CE of the light emitting element ED (FIG. 4B). Accordingly, since the dummy electrodes DME_a are included in the input sensing layer ISP_a, the input sensing layer ISP_a with greater reliability may be provided.

The dummy electrodes DME_a illustrated in FIGS. 8A and 8B may be electrically connected to the second electrode CE of the light emitting element ED provided in the display panel DP. The structure in which the dummy electrodes DME_a are connected to the second electrode CE is the same as the connection structure between the dummy electrode DME and the second electrode as illustrated in FIG. 7. Accordingly, the details thereof will be omitted.

FIGS. 9A to 9G are process cross-sectional views illustrating a manufacturing process of a display device according to an embodiment of the present disclosure.

Figure 9A:
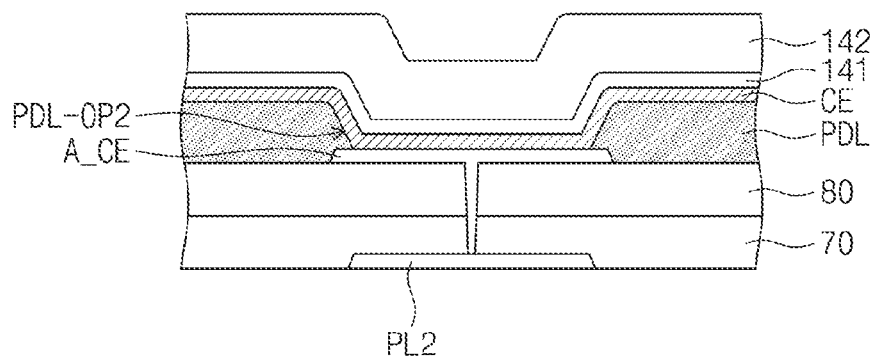
FIGS. 9A to 9G are process cross-sectional views illustrating a manufacturing process of the display device, according to an embodiment the present disclosure.

Referring to FIG. 9A, the second power line PL2 may be disposed on the sixth insulating layer 60 (see FIG. 7). The second power line PL2 may be a line (e.g., a conductive wire) for supplying the second driving voltage ELVSS.

The seventh insulating layer 70 may be disposed on the sixth insulating layer 60 and may cover the second power line PL2. The eighth insulating layer 80 may be disposed on the seventh insulating layer 70.

The auxiliary electrode A_CE may be disposed on the eighth insulating layer 80. The auxiliary electrode A_CE may be connected to the second power line PL2 through a contact hole formed through the seventh insulating layer 70 and the eighth insulating layer 80.

The pixel defining layer PDL may be disposed on the eighth insulating layer 80. For example, the auxiliary opening PDL-OP2 to expose a portion of the auxiliary electrode A_CE may be defined in the pixel defining layer PDL. The second electrode CE of the light emitting element ED (see FIG. 7) may be connected to the auxiliary electrode A_CE exposed through the auxiliary opening PDL-OP2. Alternatively, the auxiliary electrode A_CE may be omitted. When the auxiliary electrode A_CE is omitted, the second electrode CE may be directly connected to (or directly make contact with) the second power line PL2. For example, a portion of the second electrode CE may extend through the auxiliary opening PDL-OP2 to contact the second power line PL2.

The first encapsulation inorganic layer 141 and the encapsulation organic layer 142 sequentially stacked on the pixel defining layer PDL may be stacked. The first encapsulation inorganic layer 141 may include a silicon nitride layer, a silicon oxynitride layer, a silicon oxide layer, a titanium oxide layer, or an aluminum oxide layer. The encapsulation organic layer 142 may include, but is not limited to, an acrylic organic layer.

Figure 9B:
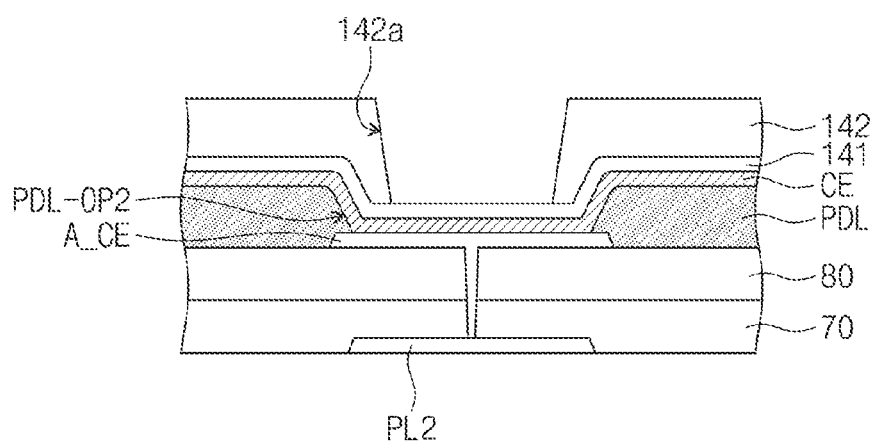

Referring to FIG. 9B, the first contact hole 142a may be formed in the encapsulation organic layer 142 through a patterning process. The first encapsulation inorganic layer 141 disposed under the encapsulation organic layer 142 may be partially exposed through the first contact hole 142a. The first contact hole 142a may overlap with the auxiliary opening PDL-OP2 of the pixel defining layer PDL, when viewed in a plan view. According to an embodiment of the present disclosure, the size of the auxiliary opening PDL-OP2 is greater than a size of the first contact hole 142a. Accordingly, the first contact hole 142a may be located in the auxiliary opening PDL-OP2.

Figure 9C:
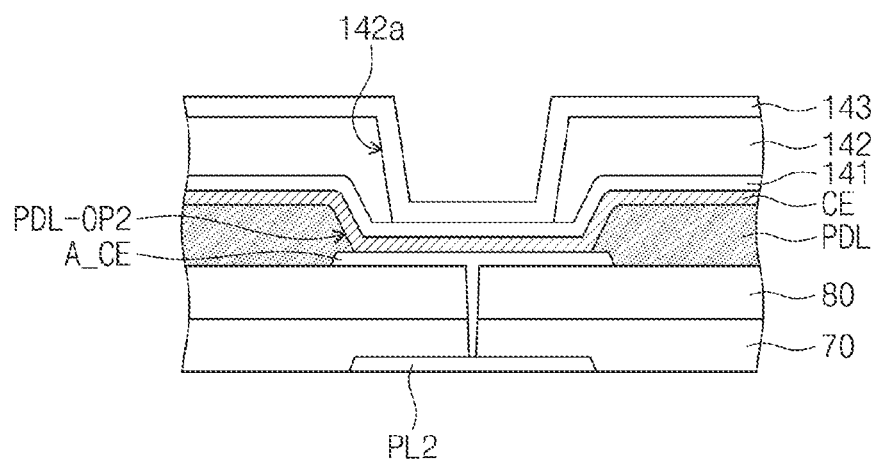

As illustrated in FIG. 9C, the second encapsulation inorganic layer 143 may be formed on a part of the encapsulation organic layer 142 including the first contact hole 142a and the first encapsulation inorganic layer 141 exposed through the first contact hole 142a.

Figure 9D:
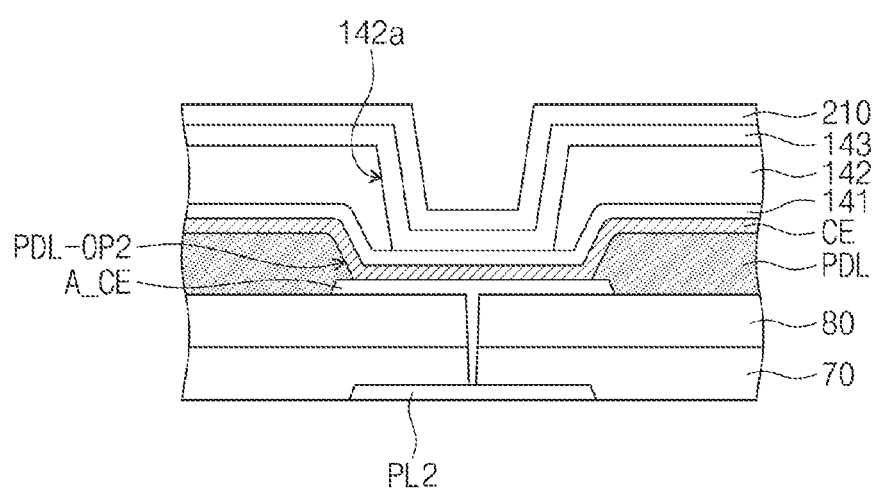

Thereafter, referring to FIG. 9D, the insulating base layer 210 of the input sensing layer ISP (see FIG. 7) may be formed on the second encapsulation inorganic layer 143. The insulating base layer 210 may be directly disposed on the second encapsulation inorganic layer 143. For example, the insulating base layer 210 may be formed to cover and contact the second encapsulation inorganic layer 143.

Figure 9E:
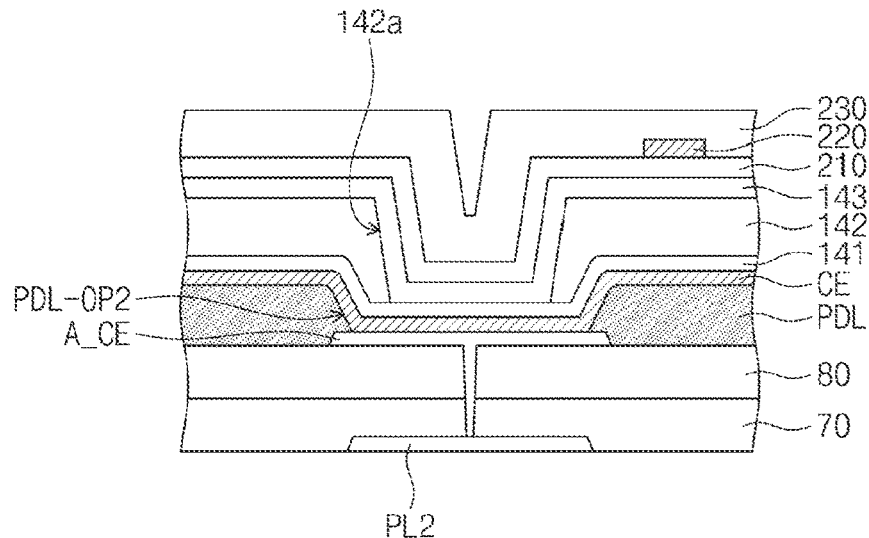

As illustrated in FIG. 9E, the first conductive layer 220 may be formed on the insulating base layer 210, and the sensing insulating layer 230 may be disposed to cover the first conductive layer 220 and the insulating base layer 210. According to an embodiment of the present disclosure, the first conductive layer 220 may include the bridge electrode BRL illustrated in FIG. 6B or the bridge part BPa illustrated in FIG. 8B.

Figure 9F:
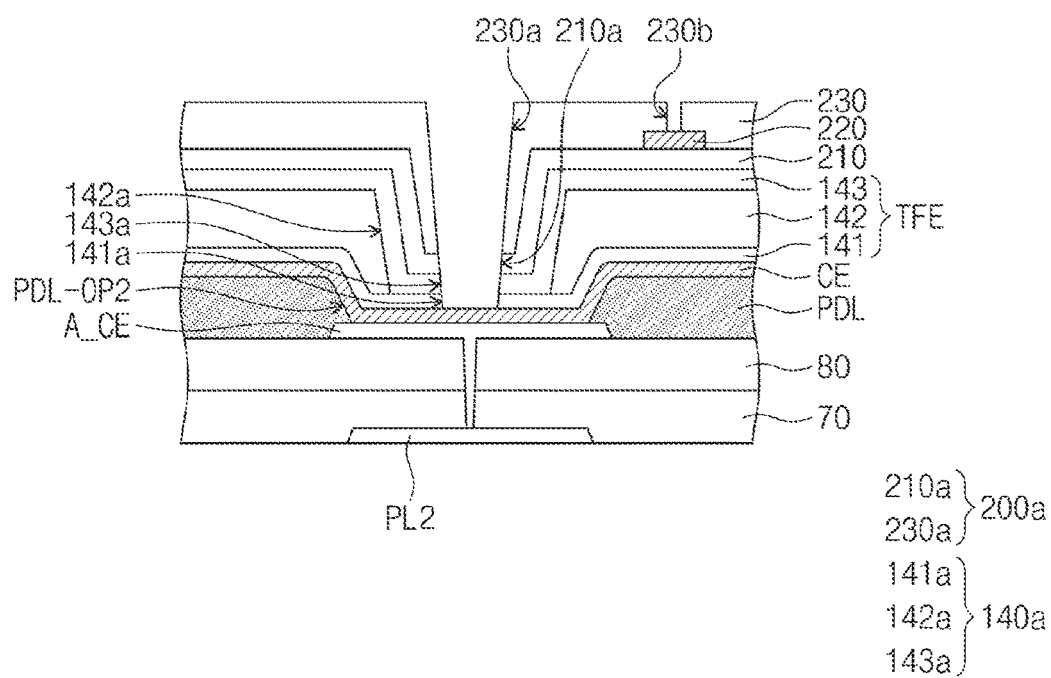

Referring to FIG. 9F, a sensing contact hole 230b may be formed in the sensing insulating layer 230 through a patterning process to expose the first conductive layer 220. The first conductive layer 220 may be partially exposed through the sensing contact hole 230b. Through the patterning process, the second dummy contact hole 230a may be further formed in the sensing insulating layer 230 and the first dummy contact hole 210a may be formed in the insulating base layer 210 at the same or substantially the same time. When the first and second dummy contact holes 210a and 230a are formed through one patterning process, a mask process may be reduced.

In addition, the second and third contact holes 141a and 143a may be formed in the first and second encapsulation inorganic layers 141 and 143 through the patterning process. In other words, first and second dummy contact holes 210a and 230a may be formed in the sensing insulating layer 230 and the insulating base layer 210 through a single patterning process, and the second and third contact holes 141a and 143a may be formed in the first and second encapsulation inorganic layers 141 and 143, respectively. The first and second dummy contact holes 210a and 230a may be aligned with the second and third contact holes 141a and 143a. Accordingly, the second electrode CE may be exposed through the first and second dummy contact holes 210a and 230a and the first to third contact holes 141a, 142a, and 143a. The first to third contact holes 141a, 142a, and 143a may be included in the contact hole 140a of the encapsulation layer TFE. The first and second dummy contact holes 210a and 230a may be included in the dummy contact hole 200a of the input sensing layer ISP (see FIG. 7).

The first and second dummy contact holes 210a and 230a, and the second and third contact holes 141a and 143a may overlap with the first contact hole 142a, and may have a size smaller than that of the first contact hole 142a. According to an embodiment of the present disclosure, each of the first and second dummy contact holes 210a and 230a, and the second and third contact holes 141a and 143a may be provided in the first contact hole 142a.

Figure 9G:
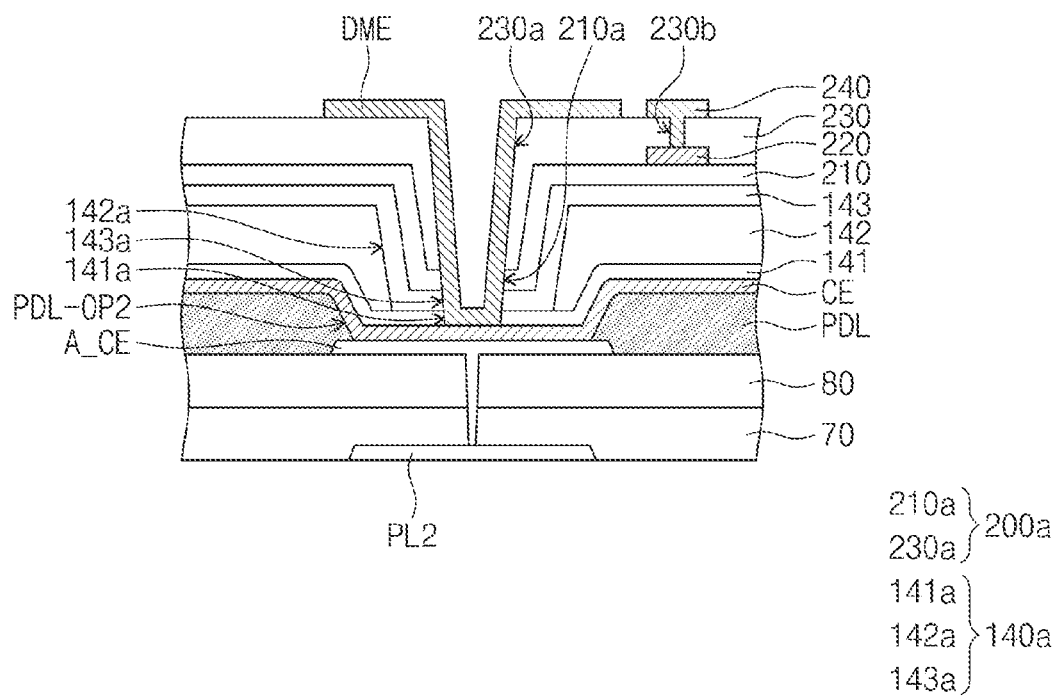

Referring to FIG. 9G, the second conductive layer 240 is formed on the sensing insulating layer 230. The second conductive layer 240 may include the first and second sensing electrodes TE1 and TE2 and the dummy electrode DME illustrated in FIG. 6B. The first sensing electrode TE1 of the second conductive layer 240 provided on the sensing insulating layer 230 may be connected to the bridge electrode BRL of the first conductive layer 220 through the sensing contact hole 230b.

The dummy electrode DME formed on the sensing insulating layer 230 may be directly connected to (or directly make contact with) the second electrode CE exposed through the first and second dummy contact holes 210a and 230a and the first to third contact holes 141a, 142a, and 143a.

The voltage drop of the second driving voltage ELVSS (see FIG. 4B) applied to the second electrode CE may be compensated or removed by electrically connecting the dummy electrode DME to the second electrode CE of the light emitting element ED. Accordingly, the second driving voltage ELVSS of a uniform or constant level may be applied to the light emitting elements ED, thereby increasing uniformity in the whole brightness of the display device DD.

In an embodiment, the process of forming the dummy contact hole 200a and the second contact hole 141a and the third contact hole 143a to connect the dummy electrode DME to the second electrode CE of the light emitting element ED are performed simultaneously with the process of forming the sensing contact hole 230b in the sensing insulating layer 230. Accordingly, the dummy electrode DME and the second electrode CE may be electrically connected with each other without an additional process.

According to an embodiment of the present disclosure, the voltage drop of the driving voltage (that is, the second driving voltage) applied to the second electrode may be compensated through the dummy electrode by electrically connecting the dummy electrode provided in the input sensing layer to the second electrode (or the cathode electrode) of the light emitting elements. Accordingly, a uniform driving voltage may be applied to the light emitting elements, thereby increasing the whole brightness uniformity of the display device.

Although various embodiments of the present disclosure have been described above for illustrative purposes, those skilled in the art will appreciate that various modifications, and substitutions are possible, without departing from the scope and spirit of the invention as disclosed in the accompanying claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a display panel including a light emitting element; and
an input sensing layer including a sensing electrode and a dummy electrode insulated from the sensing electrode, and disposed on the display panel,
wherein the light emitting element comprises:
a first electrode;
a second electrode disposed on the first electrode; and
a light emitting layer interposed between the first electrode and the second electrode, and
wherein the second electrode is electrically connected to the dummy electrode,
the display panel further comprises an encapsulation layer covering the light emitting element,
a contact hole is located in the encapsulation layer to expose the second electrode, and
wherein the dummy electrode directly contacts the second electrode through the contact hole,
wherein the encapsulation layer further comprises:
a first encapsulation inorganic layer;
an encapsulation organic layer disposed on the first encapsulation inorganic layer; and
a second encapsulation inorganic layer disposed on the encapsulation organic layer,
wherein the contact hole comprises a first contact hole located in the encapsulation organic layer, a second contact hole located in the first encapsulation inorganic layer and a third contact hole located in the second encapsulation inorganic layer,
wherein each of the second and third contact holes has a size smaller than that of the first contact hole.

2. The display device of claim 1, wherein the display panel further comprises: at least one transistor, and wherein the first electrode is connected to the at least one transistor.

3. The display device of claim 1, wherein the display panel further comprises: a power line to receive a driving voltage, wherein the second electrode is electrically connected to the power line.

4. The display device of claim 1, wherein the input sensing layer is directly disposed on the encapsulation layer.

5. The display device of claim 1, wherein the first contact hole, the second contact hole, and the third contact hole overlap each other, in a plan view.

6. The display device of claim 1, wherein the input sensing layer further comprises:
an insulating base layer;
a first conductive layer disposed on the insulating base layer;
a sensing insulating layer disposed on the first conductive layer; and
a second conductive layer disposed on the sensing insulating layer, and wherein the sensing electrode and the dummy electrode are included in the second conductive layer.

7. The display device of claim 6, wherein the insulating base layer and the sensing insulating layer include a first dummy contact hole and a second dummy contact hole corresponding to the contact hole, and wherein the dummy electrode contacts the second electrode through the contact hole, the first dummy contact hole, and the second dummy contact hole.

8. The display device of claim 6, wherein the sensing electrode further comprises:
a first sensing electrode; and
a second sensing electrode crossing and insulated from the first sensing electrode to form a mutual capacitor.

9. The display device of claim 8, wherein each of the dummy electrode, and the first and second sensing electrodes has a mesh shape.

10. The display device of claim 1, wherein the display panel comprises:
a light emitting region for outputting light from the light emitting element; and
a non-light emitting region adjacent to the light emitting region, and wherein the dummy electrode contacts the second electrode in the non-light emitting region.

11. A display device comprising:
a display panel including a light emitting element layer and an encapsulation layer disposed on the light emitting element layer; and
an input sensing layer including a sensing electrode and a dummy electrode insulated from the sensing electrode, and disposed on the encapsulation layer,
wherein the light emitting element layer comprises:
a first electrode;
an auxiliary electrode disposed on a same layer as the first electrode;
a pixel defining layer exposing the first electrode through a pixel opening and exposing the auxiliary electrode through an auxiliary opening;
a light emitting layer disposed on the first electrode exposed through the pixel opening; and
a second electrode disposed on the light emitting layer and the auxiliary electrode exposed through the auxiliary opening,
wherein the second electrode is exposed through a contact hole located in the encapsulation layer and directly contacts the dummy electrode through the contact hole, and
wherein the contact hole is provided in the auxiliary opening.

12. The display device of claim 11, wherein the display panel further comprises: at least one transistor, and wherein the first electrode is connected to the at least one transistor.

13. The display device of claim 11, wherein the display panel further comprises: a power line to receive a driving voltage, and wherein the second electrode is electrically connected to the power line.

14. The display device of claim 11, wherein the encapsulation layer further comprises:
a first encapsulation inorganic layer;
an encapsulation organic layer disposed on the first encapsulation inorganic layer; and
a second encapsulation inorganic layer disposed on the encapsulation organic layer.

15. The display device of claim 14, wherein the contact hole comprises: a first contact hole located in the encapsulation organic layer, a second contact hole located in the first encapsulation inorganic layer and a third contact hole located in the second encapsulation inorganic layer, and wherein the first contact hole, the second contact hole, and the third contact hole overlap each other in a plan view.

16. The display device of claim 11, wherein the input sensing layer comprises:
an insulating base layer;
a first conductive layer disposed on the insulating base layer; a sensing insulating layer disposed on the first conductive layer; and a second conductive layer disposed on the sensing insulating layer, and wherein the sensing electrode and the dummy electrode are included in the second conductive layer.

17. The display device of claim 16, wherein the insulating base layer and the sensing insulating layer include a first dummy contact hole and a second dummy contact hole corresponding to the contact hole, and wherein the dummy electrode contacts the second electrode through the contact hole, the first dummy contact hole, and the second dummy contact hole.

18. The display device of claim 11, wherein the auxiliary electrode is interposed between a power line to receive a driving voltage and the second electrode, to connect the second electrode to the power line.

19. A method for manufacturing a display device, the method comprising:

forming a light emitting element layer on a base layer;

forming an encapsulation layer on the light emitting element layer;

forming an input sensing layer on the encapsulation layer, and wherein the input sensing layer includes a sensing electrode and a dummy electrode insulated from the sensing electrode, wherein the light emitting element layer comprises:
a first electrode;
a second electrode disposed on the first electrode; and
a light emitting layer interposed between the first electrode and the second electrode, and wherein the second electrode is exposed through a contact hole located in the encapsulation layer and a dummy contact hole located in the input sensing layer and directly contacts the dummy electrode through the contact hole and the dummy contact hole, wherein the forming of the encapsulation layer comprises:
sequentially forming a first encapsulation inorganic layer and an encapsulation organic layer;
forming a first contact hole in the encapsulation organic layer to expose the first encapsulation inorganic layer; and
forming a second encapsulation inorganic layer on the encapsulation organic layer, wherein the contact hole comprises a first contact hole located in the encapsulation organic layer, a second contact hole located in the first encapsulation inorganic layer and a third contact hole located in the second encapsulation inorganic layer, wherein each of the second and third contact holes has a size smaller than that of the first contact hole.

20. The method of claim 19, wherein the forming of the input sensing layer comprises:

forming an insulating base layer;

forming a first conductive layer disposed on the insulating base layer;

forming a sensing insulating layer disposed on the first conductive layer;

forming the dummy contact hole on the insulating base layer and the sensing insulating layer, to correspond to the contact hole; and forming a second conductive layer on the sensing insulating layer.

21. The method of claim 19, wherein the sensing electrode and the dummy electrode are included in the second conductive layer.

* * * * *